(12) United States Patent
Mauder et al.

(10) Patent No.: US 11,837,528 B2
(45) Date of Patent: Dec. 5, 2023

(54) METHOD OF MANUFACTURING A SEMICONDUCTOR DEVICE HAVING A BOND WIRE OR CLIP BONDED TO A BONDING PAD

(71) Applicant: Infineon Technologies AG, Neubiberg (DE)

(72) Inventors: Anton Mauder, Kolbermoor (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 382 days.

(21) Appl. No.: 17/167,242

(22) Filed: Feb. 4, 2021

(65) Prior Publication Data

US 2021/0183746 A1 Jun. 17, 2021

Related U.S. Application Data

(62) Division of application No. 16/296,392, filed on Mar. 8, 2019, now Pat. No. 10,971,435.

(30) Foreign Application Priority Data

Mar. 9, 2018 (DE) .......................... 102018105462.9

(51) Int. Cl.
*H01L 23/495* (2006.01)
*H01L 23/00* (2006.01)
(Continued)

(52) U.S. Cl.
CPC .... *H01L 23/49513* (2013.01); *H01L 21/4825* (2013.01); *H01L 23/3121* (2013.01);
(Continued)

(58) Field of Classification Search
CPC .......... H01L 23/49513; H01L 21/4825; H01L 23/3121; H01L 23/49562; H01L 24/03;
(Continued)

(56) References Cited

U.S. PATENT DOCUMENTS

| | | | |
|---|---|---|---|
| 4,933,305 A | 6/1990 | Kikkawa | |
| 5,036,383 A | 7/1991 | Mori | |

(Continued)

FOREIGN PATENT DOCUMENTS

| | | |
|---|---|---|
| CN | 101771049 A | 7/2010 |
| JP | H0936276 A | 2/1997 |

*Primary Examiner* — Robert G Bachner
(74) *Attorney, Agent, or Firm* — Murphy, Bilak & Homiller, PLLC

(57) ABSTRACT

A method of manufacturing a semiconductor device includes: forming a base portion of a bonding pad on a semiconductor portion, the base portion further comprising a base layer; forming a main surface of the bonding pad, the main surface comprising a bonding region; bonding a bond wire or clip to the bonding region; and forming a supplemental structure directly on the base portion. The supplemental structure laterally adjoins the bond wire or clip or is laterally spaced apart from the bond wire or clip. A volume-related specific heat capacity of the supplemental structure is higher than a volume-related specific heat capacity of the base layer.

20 Claims, 17 Drawing Sheets

(51) Int. Cl.
- *H01L 23/31* (2006.01)
- *H01L 21/48* (2006.01)
- *H01L 29/861* (2006.01)
- *H01L 29/78* (2006.01)
- *H01L 29/40* (2006.01)
- *H01L 29/417* (2006.01)
- *H01L 29/739* (2006.01)

(52) U.S. Cl.
CPC ........ *H01L 23/49562* (2013.01); *H01L 24/03* (2013.01); *H01L 24/08* (2013.01); *H01L 24/48* (2013.01); *H01L 29/407* (2013.01); *H01L 29/41766* (2013.01); *H01L 29/7396* (2013.01); *H01L 29/7397* (2013.01); *H01L 29/7802* (2013.01); *H01L 29/7813* (2013.01); *H01L 29/8611* (2013.01); *H01L 2224/022* (2013.01); *H01L 2224/0219* (2013.01); *H01L 2224/02185* (2013.01); *H01L 2224/03011* (2013.01); *H01L 2224/04034* (2013.01); *H01L 2224/04042* (2013.01); *H01L 2224/0603* (2013.01); *H01L 2224/48111* (2013.01); *H01L 2224/48237* (2013.01); *H01L 2224/4903* (2013.01); *H01L 2224/49111* (2013.01); *H01L 2224/84815* (2013.01); *H01L 2224/8592* (2013.01); *H01L 2224/85815* (2013.01)

(58) Field of Classification Search
CPC ....... H01L 24/08; H01L 24/48; H01L 29/407; H01L 29/41766; H01L 29/7396; H01L 29/7397; H01L 29/7802; H01L 29/7813; H01L 29/8611; H01L 2224/02185; H01L 2224/0219; H01L 2224/022; H01L 2224/03011; H01L 2224/04034; H01L 2224/04042; H01L 2224/0603; H01L 2224/48111; H01L 2224/48237; H01L 2224/4903; H01L 2224/49111; H01L 2224/84815; H01L 2224/85815; H01L 2224/8592; H01L 23/4952; H01L 24/06; H01L 24/29; H01L 24/32; H01L 24/49; H01L 24/83; H01L 23/60; H01L 24/45; H01L 24/73; H01L 24/85; H01L 24/92; H01L 2224/02166; H01L 2224/0218; H01L 2224/0332; H01L 2224/0362; H01L 2224/05186; H01L 2224/05567; H01L 2224/05638; H01L 2224/05647; H01L 2224/32225; H01L 24/05; H01L 2224/05572; H01L 2224/05624; H01L 2224/291; H01L 2224/32245; H01L 2224/37124; H01L 2224/37139; H01L 2224/37144; H01L 2224/37147; H01L 2224/40227; H01L 2224/40247; H01L 2224/45014; H01L 2224/45015; H01L 2224/45124; H01L 2224/45139; H01L 2224/45144; H01L 2224/45147; H01L 2224/48137; H01L 2224/48227; H01L 2224/48247; H01L 2224/48463; H01L 2224/4847; H01L 2224/49175; H01L 2224/73265; H01L 2224/8384; H01L 2224/85205; H01L 2224/85206; H01L 2224/92247; H01L 2224/92252; H01L 2224/94; H01L 2924/00011; H01L 2924/13055; H01L 2924/351; H01L 23/4822; H01L 23/4827; H01L 23/485; H01L 23/49; H01L 29/7393

See application file for complete search history.

(56) References Cited

U.S. PATENT DOCUMENTS

| | | |
|---|---|---|
| 5,366,589 A | 11/1994 | Chang |
| 5,661,082 A | 8/1997 | Hsu et al. |
| 6,150,725 A * | 11/2000 | Misawa .............. H01L 23/3171 257/781 |
| 6,265,246 B1 | 7/2001 | Ruby et al. |
| 6,287,950 B1 | 9/2001 | Wu et al. |
| 6,313,541 B1 | 11/2001 | Chan et al. |
| 6,329,722 B1 | 12/2001 | Shih et al. |
| 6,339,257 B1 | 1/2002 | Fujiki et al. |
| 6,378,759 B1 | 4/2002 | Ho et al. |
| 6,444,295 B1 | 9/2002 | Peng et al. |
| 6,465,895 B1 | 10/2002 | Park et al. |
| 6,847,123 B2 | 1/2005 | Blackwood |
| 6,897,570 B2 | 5/2005 | Nakajima et al. |
| 7,015,580 B2 | 3/2006 | Fitzsimmons et al. |
| 7,135,759 B2 | 11/2006 | Efland et al. |
| 7,883,917 B2 | 2/2011 | Liu et al. |
| 8,105,933 B2 | 1/2012 | Hess et al. |
| 8,178,914 B2 | 5/2012 | Levine et al. |
| 8,183,663 B2 | 5/2012 | Kim et al. |
| 8,361,898 B2 | 1/2013 | Wang et al. |
| 8,716,871 B2 | 5/2014 | Tseng et al. |
| 8,759,970 B2 | 6/2014 | Akram |
| 8,802,554 B2 | 8/2014 | Sutardja |
| 8,906,705 B2 | 12/2014 | Saigoh et al. |
| 9,293,436 B2 | 3/2016 | Akiba et al. |
| 9,437,574 B2 | 9/2016 | Tran et al. |
| 10,109,610 B2 | 10/2018 | Qin et al. |
| 10,204,853 B2 | 2/2019 | Matsumoto et al. |
| 10,840,179 B2 | 11/2020 | Jackson et al. |
| 2001/0000928 A1 | 5/2001 | Lee et al. |
| 2002/0006717 A1 | 1/2002 | Yamaha |
| 2003/0076666 A1 * | 4/2003 | Daeche ............... H01L 21/4821 29/841 |
| 2005/0098605 A1 | 5/2005 | Edelstein et al. |
| 2008/0105947 A1 | 5/2008 | Kuzuhara et al. |
| 2008/0217786 A1 | 9/2008 | Kasaoka et al. |
| 2009/0098687 A1 | 4/2009 | Antol et al. |
| 2009/0243105 A1 * | 10/2009 | Lehr ...................... H01L 24/85 257/E21.585 |
| 2010/0052137 A1 | 3/2010 | Meyer et al. |
| 2012/0061796 A1 | 3/2012 | Wang |
| 2014/0346663 A1 | 11/2014 | Chopin et al. |
| 2014/0367859 A1 | 12/2014 | Carpenter et al. |
| 2015/0116968 A1 | 4/2015 | Yamada et al. |
| 2017/0092562 A1 | 3/2017 | Kato |
| 2018/0151467 A1 | 5/2018 | Venugopal et al. |

* cited by examiner

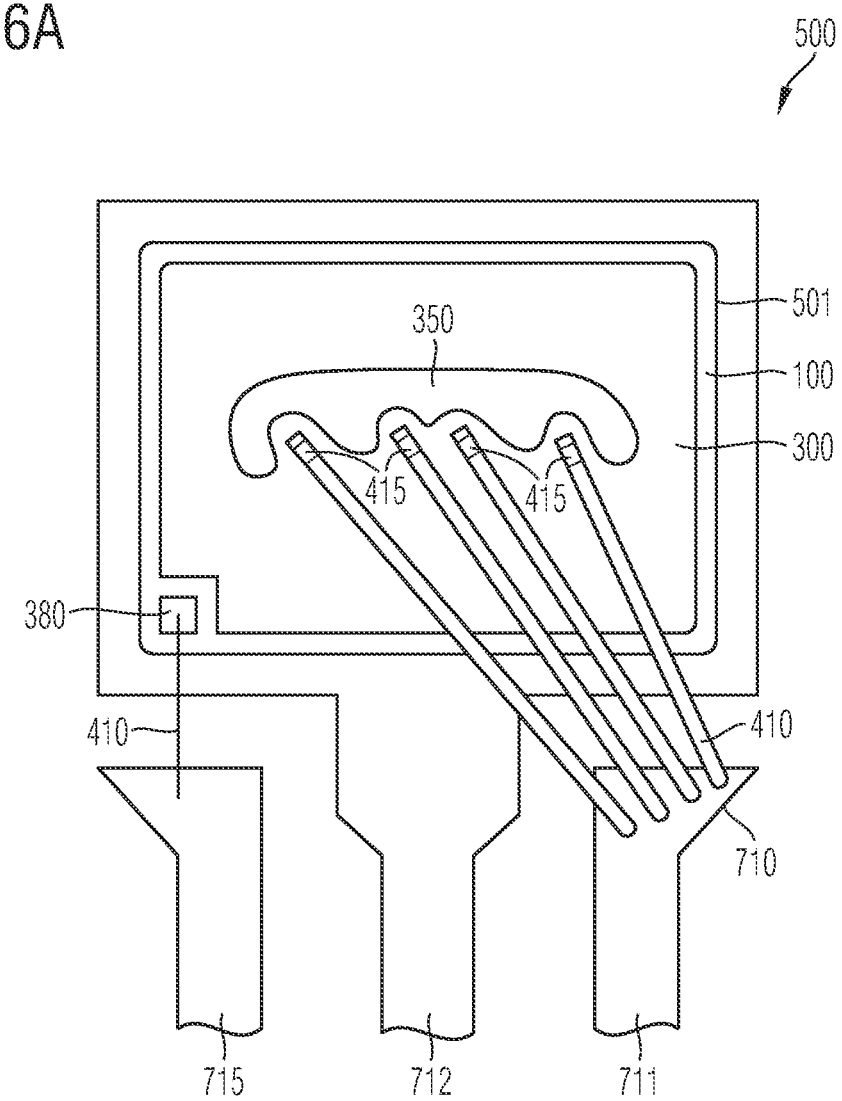

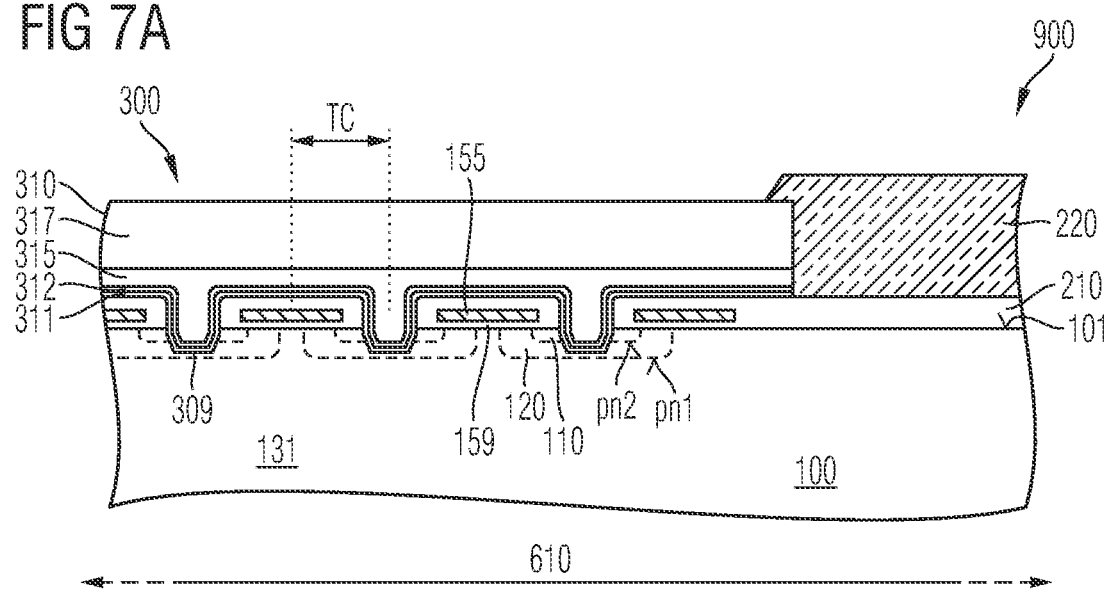
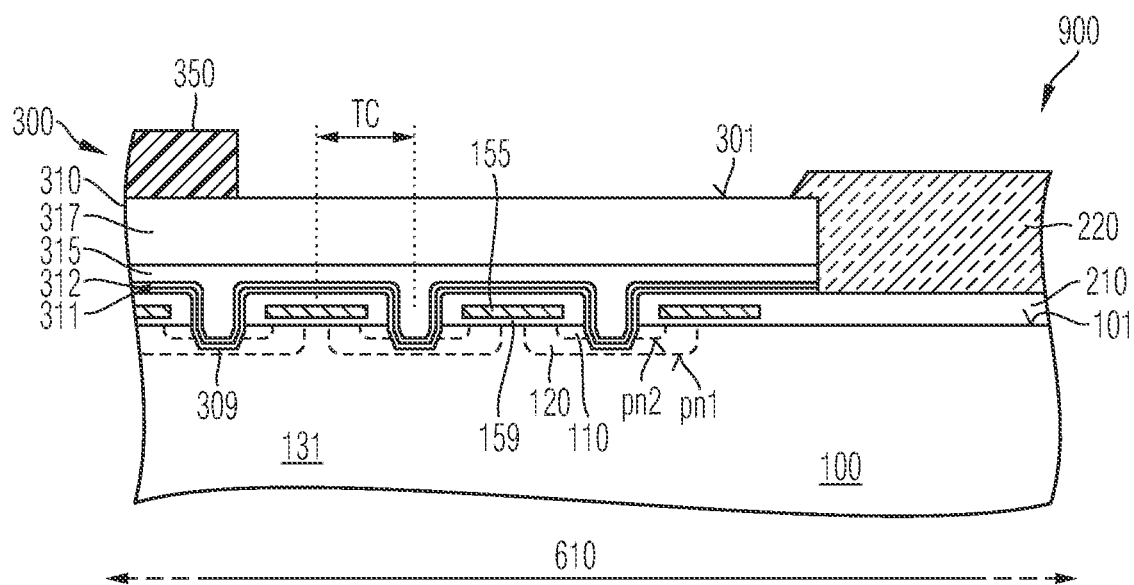

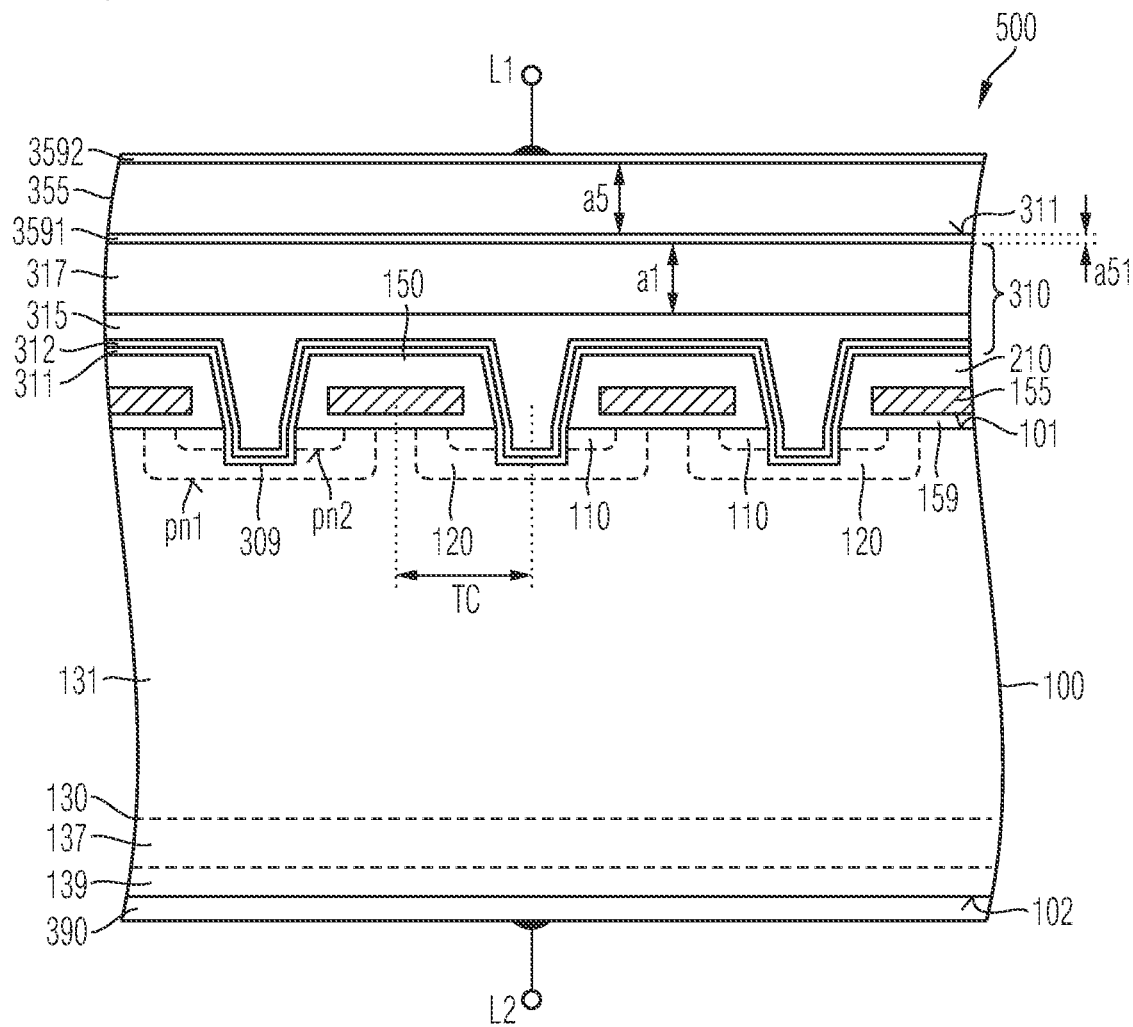

METHOD OF MANUFACTURING A SEMICONDUCTOR DEVICE HAVING A BOND WIRE OR CLIP BONDED TO A BONDING PAD

BACKGROUND

Semiconductor packages of power semiconductor devices such as power semiconductor diodes, IGFETs (insulated gate field effect transistors) and IGBTs (insulated gate bipolar transistors) typically have metal leads that allow connection of the power semiconductor device to a circuit board or to another electronic device. Bond wires electrically connect the metal leads with contact pads formed directly on the semiconductor die and bridge the difference in scale between on-chip wiring and external wiring of the power semiconductor device. For wire bonding, typically a bond wire is positioned over a bonding pad and a tip or wedge forces the wire onto the bonding pad. Contemporaneously, heat, ultrasonic energy or another type of radiation is applied to the bonding pad and the piece of wire on the bonding pad to form a metallurgic bond between the bond wire and the bonding pad. The bonding pad must be sufficiently rugged to accommodate the mechanical strain exerted onto the semiconductor chip during the bonding process. In addition, a high thermal capacity and/or ruggedness of the bonding pad and the bond is desirable to improve short-circuit and avalanche ruggedness of the semiconductor device.

There is a need for reliable semiconductor devices with high thermal and mechanical ruggedness.

SUMMARY

The present disclosure concerns a semiconductor device that includes a bonding pad including a base portion and a main surface. The base portion has a base layer. The main surface has a bonding region. A bond wire or clip is bonded to the bonding region. A supplemental structure is in direct contact with the base portion next to the bonding region. A specific heat capacity of the supplemental structure is higher than a specific heat capacity of the base layer.

The present disclosure further concerns a method of manufacturing a semiconductor device. The method includes forming a bonding pad base portion on a semiconductor portion. The base portion includes a base layer. A bonding pad main surface is formed that includes a bonding region. A bond wire or clip is bonded to the bonding region. A supplemental structure is formed directly on the base portion. A specific heat capacity of the supplemental structure is higher than a specific heat capacity of the base layer.

The present disclosure also concerns a semiconductor device that includes a semiconductor portion including a doped region. A bonding pad includes a base portion directly connected with the doped region. A supplemental structure is in direct contact with the base portion. The supplemental structure includes a core portion and a liner portion. The core portion contains silver. The liner portion separates the core portion from the base portion.

Those skilled in the art will recognize additional features and advantages upon reading the following detailed description and on viewing the accompanying drawings.

BRIEF DESCRIPTION OF THE FIGURES

The accompanying drawings are included to provide a further understanding of the embodiments and are incorporated in and constitute a part of this specification. The drawings illustrate the embodiments of the present disclosure and together with the description serve to explain principles of the embodiments. Other embodiments and intended advantages will be readily appreciated as they become better understood by reference to the following detailed description.

FIG. 6A is a schematic plan view of a portion of a semiconductor device with supplemental structure according to a further embodiment concerning a TO-220 package.

FIG. 7A is a schematic cross-sectional view of a portion of a semiconductor substrate for illustrating a method of manufacturing semiconductor devices including a supplemental structure next to a bond foot according to an embodiment forming the supplemental structure before wire-bonding, after forming a bonding pad.

FIG. 7B is a schematic vertical cross-sectional of the semiconductor substrate portion of FIG. 7A, after forming the supplemental structure.

FIG. 9 is a schematic cross-sectional view of a portion of a semiconductor device with a bonding pad including a supplemental structure with a core portion containing silver according to another embodiment.

DETAILED DESCRIPTION

In the following detailed description, reference is made to the accompanying drawings, which form a part hereof and in which are shown by way of illustrations specific embodiments in which the techniques may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
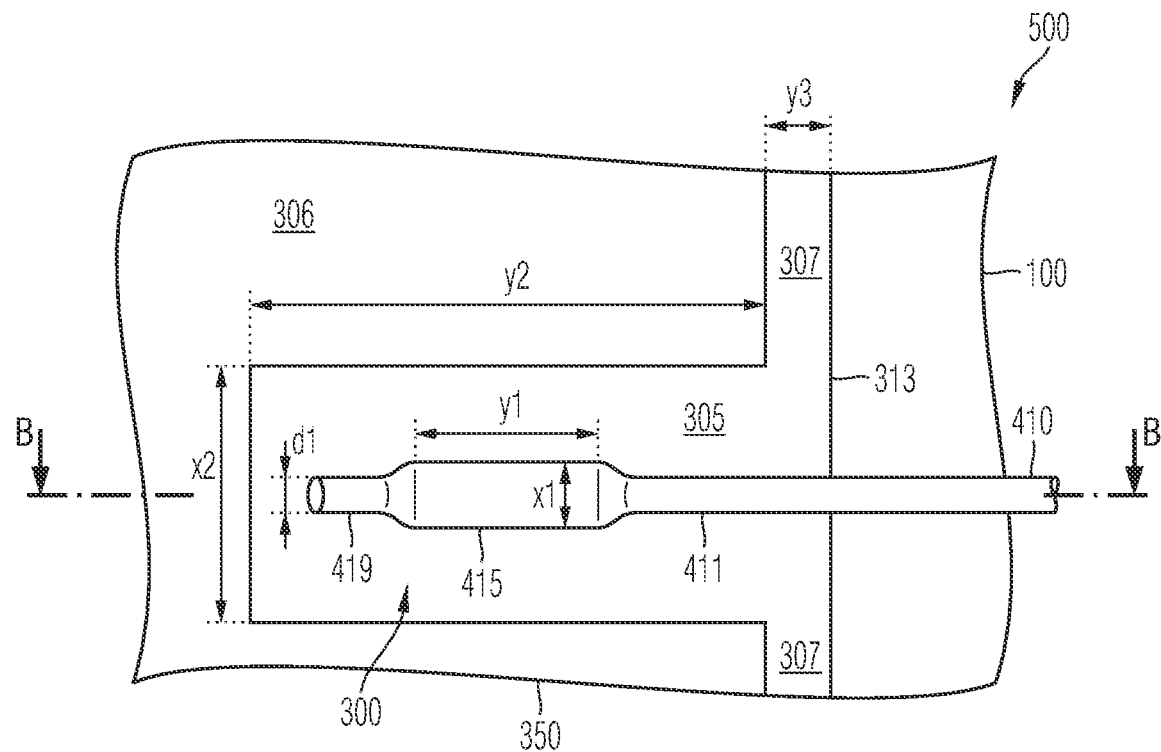
FIG. 1A is a schematic plan view of a portion of a semiconductor device including a bond wire or clip bonded onto a bonding pad and a supplemental structure with high heat capacity next to a bond foot of the bond wire or clip according to an embodiment.
Figure 1B:
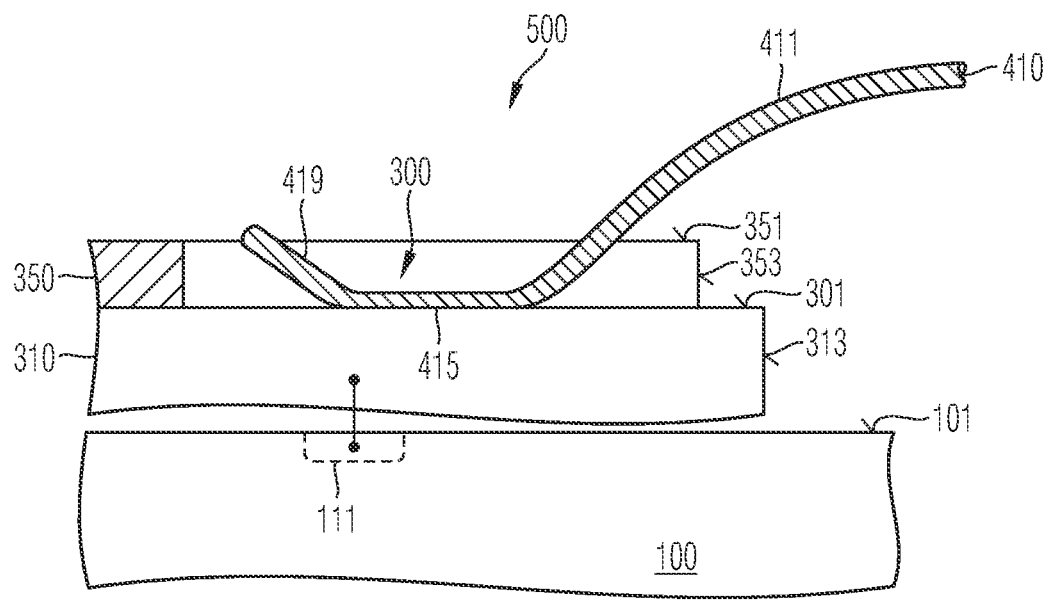
FIG. 1B is a vertical cross-sectional view of the semiconductor device portion of FIG. 1A.

FIG. 1A shows a plan view of a semiconductor device 500 in the area of a bond connection and FIG. 1B is a vertical cross-sectional view of the semiconductor device 500 along line B-B of FIG. 1A.

The semiconductor device 500 is suitable for power applications, for example, a power semiconductor diode, an IGFET, for example, an MOSFET (metal oxide semiconductor FET) in the usual meaning including IGFETs with metals gates as well as IGFETs with polysilicon gates, an IGBT, an MCDs (MOS controlled diodes), or a smart power semiconductor device that includes CMOS (complementary metal oxide semiconductor) circuits, such as sensor circuits and/or control circuits in addition to a power semiconductor unit.

The semiconductor device 500 is based on a semiconductor portion 100 from a single-crystalline semiconductor material such as silicon (Si), germanium (Ge), silicon germanium (SiGe), silicon carbide (SiC), or an AIIIBV semiconductor.

A first surface 101 at a front side of the semiconductor portion 100 is planar or defined by coplanar surface sections and is parallel to a second surface on the back of the semiconductor portion 100. In the plane of FIG. 1A the semiconductor portion 100 may have a rectangular shape with an edge length in the range of several millimeters. A normal to the first surface 101 defines a vertical direction and directions orthogonal to the vertical direction are horizontal directions.

A bonding pad 300 at the front side of the semiconductor portion 100 is electrically connected to one or more doped regions 111 in the semiconductor portion 100.

For example, the doped region 111 may be an anode region of a power semiconductor diode and the bonding pad 300 may directly adjoin the first surface 101 to form an ohmic contact with the doped region 111. According to other embodiments, an interlayer dielectric may separate the bonding pad 300 from the semiconductor portion 100 and contact portions of the bonding pad 300 extend through openings in the interlayer dielectric and electrically connect the bonding pad 300 with a plurality of separated doped regions 111 that may include the source zones and body regions of transistor cells, by way of example.

The bonding pad 300 includes a base portion 310, which may be a homogeneous structure, for example, from an alloy containing aluminum, e.g., AlCu, AlSi, AlSiCu or which may have a layered structure including sublayers of different metals, e.g., a contact layer with silicide sections, a barrier layer containing at least one of titanium and tantalum, a fill layer for filling narrow contact portions, e.g., a tungsten layer and/or a base layer from aluminum or an aluminum alloy such as AlCu, AlSi or AlSiCu.

A bond wire or clip 410 is bonded on a horizontal portion of a main surface 301 of the bonding pad 300 in a bonding region 305.

The bond wire or clip 410 may be a round wire with a diameter in a range from, e.g., 25 µm to 500 µm, a flat, ribbon-like wire with approximately rectangular cross-sectional shape, wherein a long side of the cross-section is at least twice as large as a short side. The round or flat wire may contain, as main constituent(s), at least one of gold (Au), silver (Ag), copper (Cu) and aluminum (Al), for example, alloys containing one, two or more of Al, Au, Ag and Cu. The bond wire or clip 410 may be a copper clip with a thickness of at least 50 µm and a cross-sectional area of at least 0.5 mm$^2$.

The bonding process may to some degree deform a portion of the bond wire or clip 410 directly bonded onto the main surface 301, wherein the bonded portions forms a bond foot 415. The bond foot 415 may be a mechanically flattened section of the bond wire or clip 410 or a cone or ball of temporarily molten and re-solidified material of the bond wire or clip 410.

A loop portion 411 of the bond wire or clip 410 connects the bond foot 415 on the bonding pad 300 with a further bond foot of the bond wire or clip 410 on a metal lead or carrier plate of the same or another semiconductor die.

In case of wedge-bonding, the bond foot 415 has a first length y1 in a direction parallel to a longitudinal direction of the bond wire or clip 410 and a first width x1 in a direction orthogonal to the longitudinal direction of the bond wire or clip 410. The bond wire or clip 410 may further include a tail portion 419 forming a stub projecting from the bond foot 415 at a side opposite to the loop portion 411.

In case of ball bonding (not shown in FIGS. 1A and 1B), the bond foot 415 may have a substantially circular shape leading to equal first length y1 and first width x1. The bond wire or clip 410 may have a vertical start of the loop portion 411 before the bond wire or clip 410 is leading towards the further bond foot on the metal lead or carrier plate of the same or another semiconductor die. In case the bond wire or clip 410 includes a copper clip, the bonding process may include a reflow soldering.

The bonding region 305 is a part of the main surface 301 of the bonding pad 300 reserved for wire bonding or reflow soldering of a copper clip. Dimensions of the bonding region 305 depend on parameters such as bonding technique, cross-sectional area of the bond wire or clip 410, and placement preciseness of the bonding tool. The bonding region 305 may have a second length y2 parallel to the longitudinal axis of the bond wire or clip 410 and a second width x2 orthogonal to the longitudinal axis of the bond wire or clip 410. The second length y2 may be at least 150% or at least 200% of the first length y1 of the bond foot 415. The second width x2 may be at least 150% or at least 200% of the first width x1, e.g., at least 2 µm or at least 5 µm.

A supplemental structure 350 next to the bond foot 415 on the main surface 301 has a higher specific heat capacity than a base layer 317 of the base portion 310. For example, the specific heat capacity of the supplemental structure 350 is at least 3.5 J/cm$^3$K, e.g., greater than 3.7 J/cm$^3$K.

The supplemental structure 350 is formed next to the bond wire or clip 410, wherein both the bond wire and clip 410 and the supplemental structure 350 are formed at the same side of the bonding pad 300 opposite to the semiconductor portion 100. The supplemental structure 350 may directly adjoin a portion of the bond wire and clip 410, e.g., the bonding foot 415 or may be horizontally separated from the bond wire and clip 410 and the bonding foot 415 by some few micrometers, e.g., by at most 50 µm, by at most 30 µm or by at most 5 µm and by at least 0.5 µm, e.g., at least 1 µm.

The supplemental structure 350 may be homogenous or may include a core portion and liner portion at least covering the core portion. The supplemental structure 350 may be from a conductive material such as nickel (Ni) with a specific heat capacity of approximately 3.95 J/cm$^3$K or from an inorganic dielectric material such as cobalt nickel oxide, tungsten carbide with a specific heat capacity of approximately 4.9 J/cm$^3$K, topaz (Al$_2$$^{[6]}$[(F,OH)$_2$| SiO$_4$]) with a specific heat capacity of approximately 4.44 J/cm$^3$K and lithium fluoride (LiF) with a specific heat capacity of approximately 4.01 J/cm$^3$K, wherein for each of the mentioned materials the precise value for the heat capacity depends on further physical variables such as deposition conditions and density.

The supplemental structure 350 may be continuous or fine-patterned, e.g., may form a narrow, regular grid or may include a dense, regular pattern of isolated substructures, e.g., islands. For example, the supplemental structure 350 includes a narrow grid of nickel.

According to an embodiment the supplemental structure 350 includes phenolic resin with a specific heat capacity of at least 3.0 J/cm$^3$K, e.g., about 3.77 J/cm$^3$K. In addition to phenolic resin the supplemental structure 350 may include a material of higher thermal conductivity than phenolic resin.

In case the supplemental structure 350 is formed before bonding process, the supplemental structure 350 is formed exclusively in a blank region 306 outside the bonding regions 305, which are reserved for the bonding process. The blank region 306 may also exclude a pad edge area 307 that extends along a lateral outer surface 313 of the base portion 310, wherein a width y3 of the pad edge area 307 may be at least 1 µm.

The supplemental structure 350 may cover the complete blank region 306 or only portions thereof. For example, the supplemental structure 350 may be formed on only one side of each bond foot 415, on two sides, on three sides or on all four sides of the bond foot 415.

In case the supplemental structure 350 is formed after the bonding process, the blank region 306 may extend up to the lateral outer surface 313 of the base portion 310 and the supplemental structure 350 may enwrap and directly coat a portion of the bond wire or clip 410 including the bond foot 415.

As observed by the inventors, in some power semiconductor devices the thermal stress occurring during a certain electrical overstress results in a partial melting of the bonding pad 300 next to a bond foot 415 rather than directly below the bond foot 415. The local melting indicates a local temperature maximum next to but not directly below the bond foot 415, where the bond wire or clip 410 dissipates thermal energy. The supplemental structure 350 locally increases the heat capacity around the bond foot 415, temporarily absorbs the local excess of thermal energy during repeated avalanche or short circuit events and gradually releases the stored thermal energy between the avalanche and short circuit events.

The supplemental structure 350 forms a local temporary heat storage which is effective as local heat sink close to the bond foot 415, in such manner prevents a local melting of the bonding pad, and increases avalanche and short-circuit ruggedness of the semiconductor device 500.

Since the load current flows directly from the bonding pad 300 to the bond wire or clip 410, the load current passes-by the supplemental structure 350. Therefore a specific electric resistance of the materials of the supplemental structure 350 may be irrelevant and can be higher than for the bonding pad 300. High-ohmic materials and dielectric materials with high specific electrical resistance have no adverse impact on device performance. The materials for the supplemental structure may be exclusively selected in view of heat capacity and mechanical strength and can be adapted to the temperature expansion coefficients of the semiconductor portion 100.

Figure 2A:
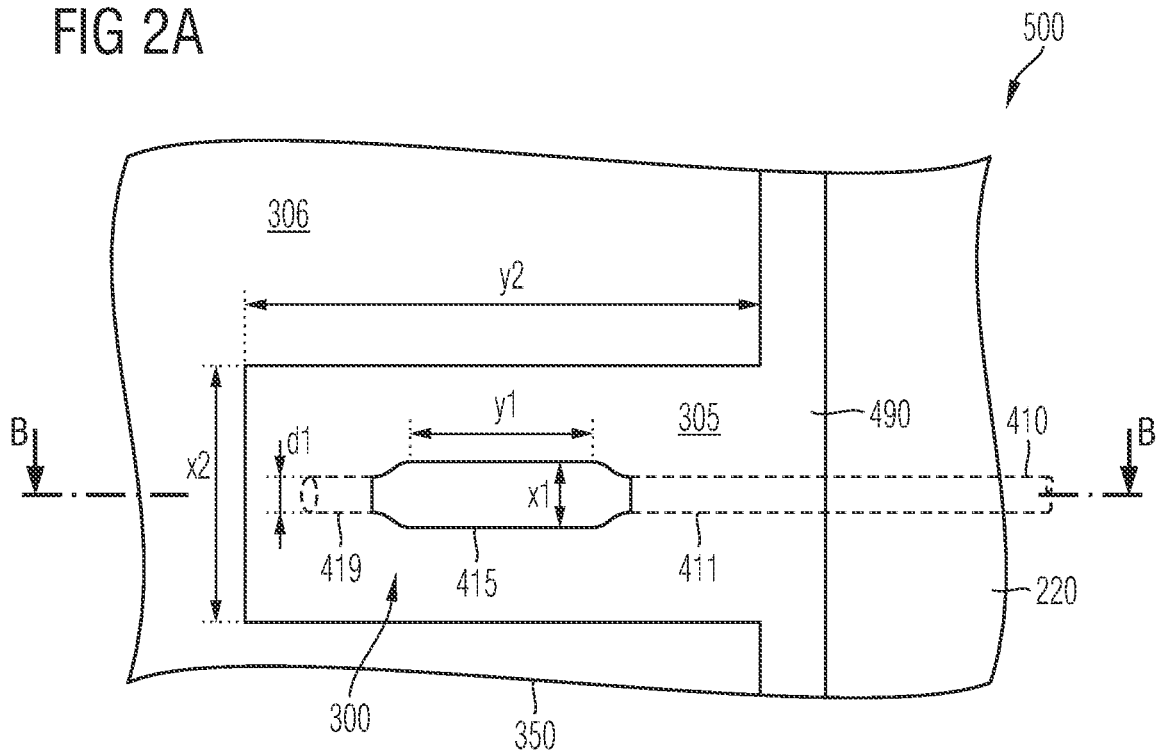
FIG. 2A is a schematic horizontal cross-sectional view of a portion of a semiconductor device according to an embodiment combining wedge-bonding and a supplemental structure from a phenolic resin.
Figure 2B:
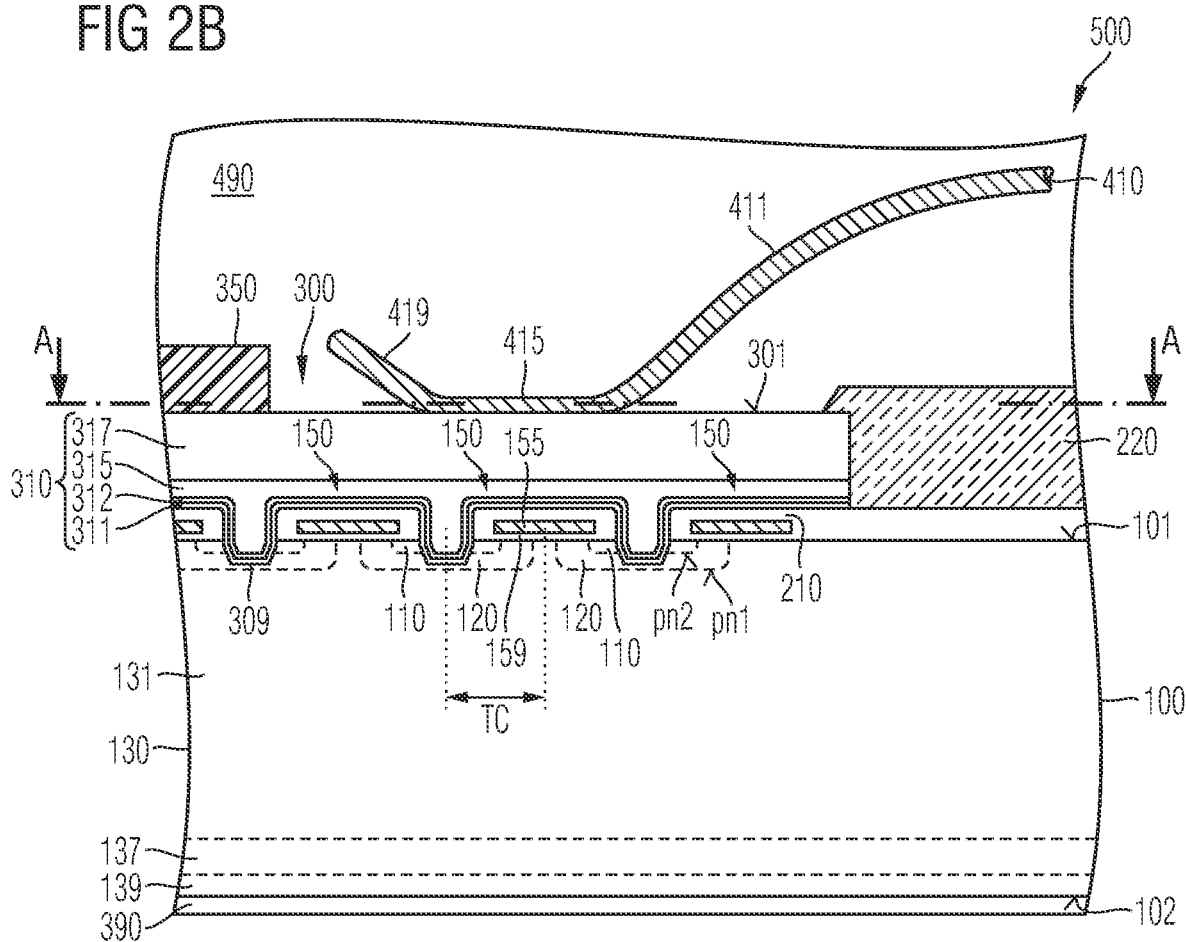
FIG. 2B is a vertical cross-sectional view of the semiconductor device portion of FIG. 2A.

FIGS. 2A to 2B combine wedge-bonding with a supplemental structure 350 formed on a bonding pad 300 that may form a first load electrode electrically connected to transistor cells TC with planar gate structures 150.

The semiconductor device 500 may be an IGFET, an IGBT or an MCD and includes a plurality of transistor cells TC electrically connected in parallel to each other.

The transistor cells TC are formed along a first surface 101 of a semiconductor portion 100 at a front side of the semiconductor device 500. The transistor cells TC may control a load current flow between two load electrodes at the front side. The illustrated embodiment concerns a vertical device, with a load current flow between a first load electrode at the front side and a second load electrode on the back, wherein between the transistor cells TC and a second surface 102 opposite to the first surface 101 the semiconductor portion 100 includes a drift structure 130. The drift structure 130 may include a lightly doped drift zone 131 and a heavily doped contact portion 139 along the second surface 102. A dopant concentration in the contact portion 139 is sufficiently high to form an ohmic contact with a second load electrode 390 directly adjoining the second surface 102. The contact portion 139 may be from the same conductivity type as the drift zone 131 in case the semiconductor device 500 is an IGFET, may be a layer of the opposite conductivity type in case the semiconductor device 500 is an IGBT and may include zones of both conductivity types alternating along at least one horizontal direction in case the semiconductor device 500 is an RC-IGBT. A field stop or buffer layer 137 may be formed directly (sandwiched) between the drift zone 131 and the contact portion 139, wherein the field stop or buffer layer 137 forms a unipolar junction with the drift zone 131 and a unipolar junction or a pn junction with the contact portion 139. A mean dopant concentration in the field stop or buffer layer 137 is at least twice as high as in the drift zone 131 and at most half as high as in the contact portion 139.

The transistor cells TC include body regions 120 forming first pn junctions pn1 with the drift structure 130 and second pn junctions pn2 with source zones 110 formed directly between the first surface 101 and the body regions 120, wherein the body regions 120 separate the source zones 110 from the drift structure 130 along the first surface 101.

The transistor cells TC further include a gate structure 150 that includes a conductive gate electrode 155, which may include or consist of a heavily doped polycrystalline silicon layer or a metal-containing layer. A gate dielectric 159 separates the gate electrode 155 from the semiconductor portion 100, wherein the gate dielectric 159 capacitively couples the gate electrode 155 to channel portions of the body regions 120 along the first surface 101.

The gate dielectric 159 may include or consist of a semiconductor oxide, for example, thermally grown or deposited silicon oxide, silicon nitride, for example, deposited or thermally grown nitride, a semiconductor oxynitride, for example, silicon oxynitride or a combination thereof.

The gate structure 150 is a lateral gate formed outside the semiconductor portion 100 along the first surface 101, wherein the gate structure 150 may include a plurality of gate stripes or may form a gate grid.

For the following description, the drift zone 131 and the source zones 110 are n-type and the body regions 120 are p-type. Similar considerations as outlined below for n-channel transistor cells TC apply to embodiments with p-channel transistor cells based on n-type body regions 120, p-type drift zone 131 and p-type source zones 110.

When a voltage applied to the gate electrode 155 exceeds a preset threshold voltage, electrons accumulate in the channel portions of the body regions 120 and form inversion channels along the gate dielectric 159. The inversion channels short-circuit the first pn junction pn1 for electrons and an unipolar load current flows between the source zones and the contact portion 139. In case of IGBTs, the unipolar load current triggers a bipolar current in the pnp structure formed by the body region 120, the drift zone 131 and p-type sections of the contact portion 139.

An interlayer dielectric 210 separates the gate electrodes 155 from a bonding pad 300. The bonding pad 300 may form a first load electrode for a load current. Contact portions 309 of the bonding pad 300 extend through openings in the interlayer dielectric 210 and the gate structure 150 to or into the semiconductor portion 100 and directly adjoin the source zones 110 and the body regions 120. The contact portions 309 are part of a base portion 310 of the bonding pad 300.

The base portion 310 of the bonding pad 300 includes at least a base layer 317 from aluminum (Al) or an aluminum alloy, for example, AlCu, AlSiCu or AlSi. The base layer 317 may directly adjoin the semiconductor portion 100.

According to the illustrated embodiment the base portion 310 may include one or more further layers, e.g., a contact layer 311 of a metal forming a silicide, for example, tantalum (Ta) or titanium (Ti). The contact layer 311 may include silicide portions forming low-ohmic contacts to the semiconductor portion 100 and not-silicided portions along the interlayer dielectric 210. A barrier layer 312 from at least one of titanium, tantalum, titanium nitride (TiN), and tantalum nitride (TaN) may be formed directly on the contact layer 311 and prevents dopants from diffusing out of the semiconductor portion 100 and/or metal atoms from diffusing from the bonding pad 300 into the semiconductor portion 100. A fill layer 315 from, e.g., tungsten (W) may form the core of the contact portions 309 and may also form a continuous layer with a horizontal top surface above the gate structures 150 and the contact portions 309. The base layer 317 may directly adjoin the fill layer 315.

An intermetal dielectric 220 may directly adjoin the bonding pad 300 in a lateral direction and may cover sections of the semiconductor portion 100 and/or the interlayer dielectric 210 next to the bonding pad 300. The intermetal dielectric 220 may separate the bonding pad 300 from a neighboring bonding pad and/or from a lateral outer surface of the semiconductor portion 100. The intermetal dielectric 220 may contain a polyimide, a silicone or a silicon nitride, by way of example.

A bond wire or clip 410 is bonded onto a main surface 301 of the bonding pad 300. The bond wire or clip 410 may have a diameter dl in a range from 25 µm to 500 µm. A bond foot 415 directly adjoins the main surface 301.

Wedge-bonding may form a bond foot 415 by flattening a portion of the bond wire or clip 410, wherein a tail portion 419 may protrude from the bond foot 415 at the opposite side of a loop portion 411. Ball-bonding may form a bond foot 415, which shape approximates a flat-bottomed ball without tail portion. The loop portion 411 connects the bond foot 415 on the bonding pad 300 of the semiconductor device 500 with a further bond foot on a metal lead of the semiconductor device 500. The bond wire or clip 410 may contain, as main constituent, at least one of aluminum (Al), gold (Au), silver (Ag) and copper (Cu).

Outside a bonding region 305 and spaced from the bond wire or clip 410, a supplemental structure 350 from a phenolic resin is in direct with the main surface 301. The supplemental structure 350 may be in the longitudinal projection of the bond wire or clip 410, below the loop portion 411 and/or on at least one side of the bond foot 415.

Phenolic resin has a comparatively high specific heat capacity of about 3.77 J/cm³K, is a material commonly used in semiconductor industry and shows high thermal stability. Layers of phenolic resin may be patterned by using photoresistive masks deposited on the layer of phenolic resin or by modifying the phenolic resin by adding photoactive groups such that a layer of the modified phenolic resin may be patterned by photolithography without additional photoresist layer. Alternatively or in addition, the phenolic resin may be mixed with components with higher thermal conductivity. A vertical extension of the supplemental structure 350 from phenolic resin may be in a range from 5 µm to several hundred µm, for example in a range from 10 µm to 100 µm.

The supplemental structure 350 has a greater specific heat capacity than a main portion of the bonding pad 300 and avoids a local overheating which otherwise occurs in the vicinity of the bond foot 415 in case of repeated avalanche and/or short circuit events.

A sealing structure 490 seals the semiconductor portion 100 and the bond wire or clips 410 in a protective enclosure. The sealing structure 490 may include a molding compound. For example, the sealing structure 490 may include an epoxy resin, a potting gel like a silicone gel, a glass, or a ceramic gel. The molding compound is typically selected to ensure an electrical blocking capability of the semiconductor portion 100 and/or an electrical insulation of the semiconductor portion 100 and/or to protect the semiconductor portion 100 against moisture. Typically, selection of the molding compound results from a trade-off considering mechanical ruggedness, weight, material costs and manufacturing efficiency. The specific heat capacity of silicone is about 1.6 J/cm³K to about 1.7 J/cm³K and the specific heat capacity of epoxy resins is in a range from 1.2 J/cm³K to 2.0 J/cm₃K. Instead, the specific heat capacity of a supplemental structure 350 of, e.g., phenolic resin is typically at least 30%, for example at least 50% or even more than 100% higher than that of the molding compound of the sealing structure 490, e.g., at least 3.0 J/cm³K.

Figure 3A:
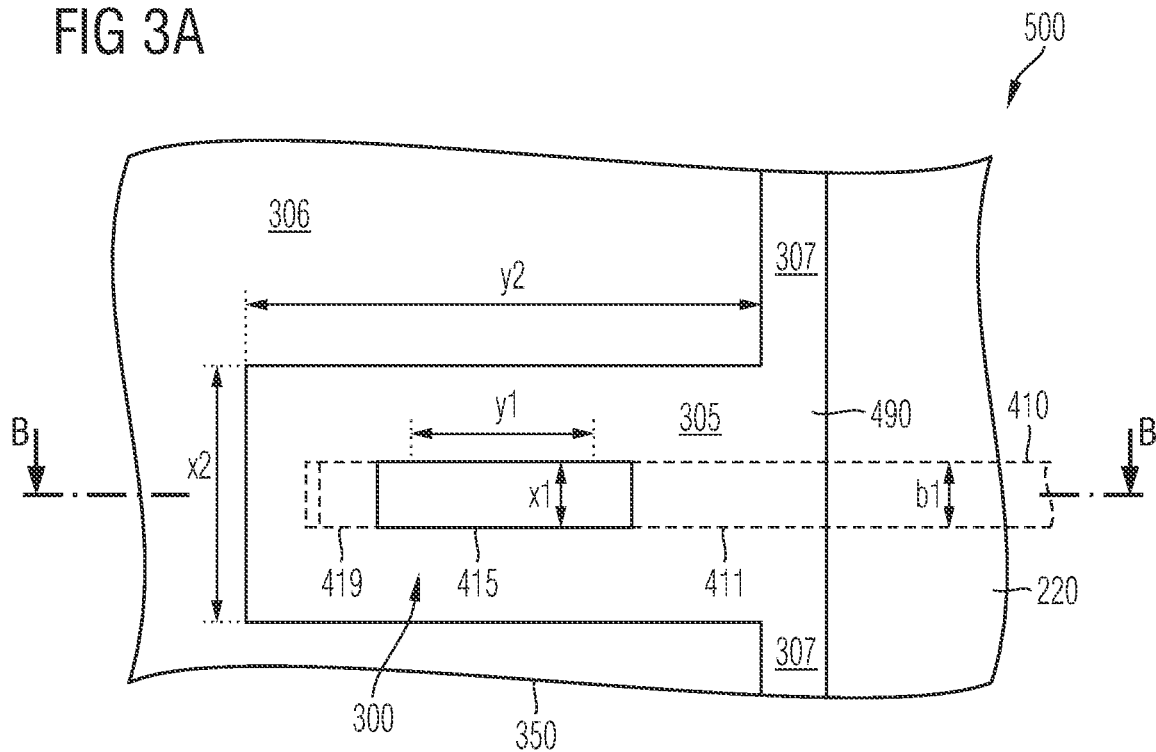
FIG. 3A is a schematic horizontal cross-sectional view of a portion of a semiconductor device according to an embodiment combining ribbon-bonding with a supplemental structure that includes a core portion and a layer portion.
Figure 3B:
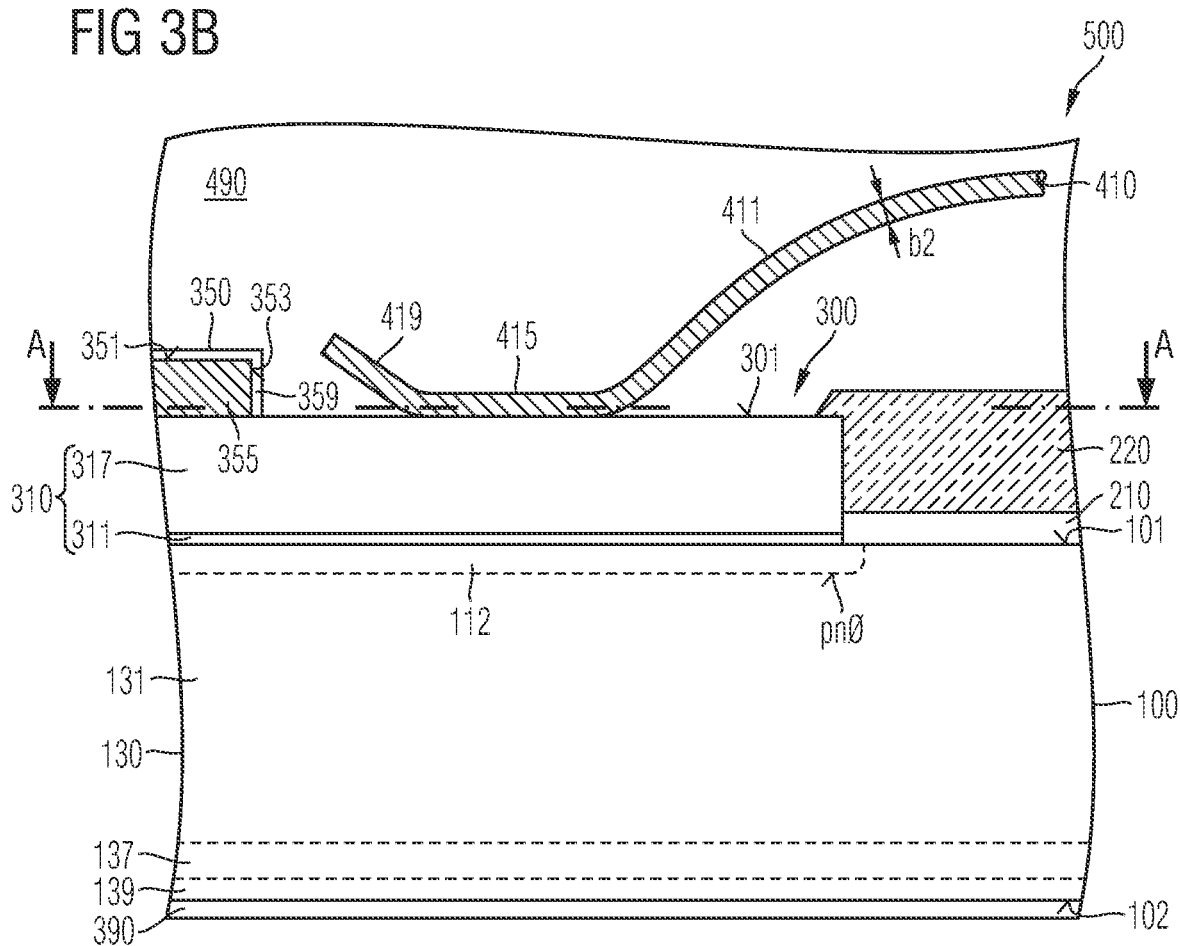
FIG. 3B is a vertical cross-sectional view of the semiconductor device portion of FIG. 3A.

FIGS. 3A to 3B combine ribbon-bonding with a supplemental structure 350 that includes an encapsulated core portion 355 in combination with a power semiconductor diode.

Instead of transistor cells TC, the semiconductor portion 100 may include a single doped region forming an anode region 112 that forms a diode junction pn0 with the drift structure 130. A base portion 310 of a bonding pad 300 directly adjoins the first surface 101 of the semiconductor portion 100. The base portion 310 includes a base layer 317 from aluminum or an aluminum alloy, wherein the base layer 317 may directly adjoin the anode region 112. The base portion 310 may further include a contact layer 311 containing a metal forming a metal silicide, e.g., titanium silicide (TiSi) at the interface to the semiconductor portion 100.

A bond wire or clip 410 may be a ribbon or a clip with approximately rectangular cross-sectional area wherein a width b1 of the bond wire or clip 410 is at least two times or at least three times a thickness b2 of the bond wire or clip 410.

The supplemental structure 350 includes a core portion 355 from an auxiliary material with a specific heat capacity higher than the base layer 317. The auxiliary material has a high specific heat capacity, e.g., higher than copper. The auxiliary material may be a metal-containing material. The core portion 355 may be from or may contain as main constituent at least one of silver, tungsten, molybdenum, cobalt, nickel, nickel oxide, a nickel alloy, tungsten carbide, topaz, lithium fluoride, or a phenolic resin.

The supplemental structure 350 may further include a liner portion 359 that may cover at least a top surface 351 of the core portion 355, wherein the top surface 351 is parallel to the first surface 101. In addition, the liner portion 359 may cover sidewalls 353 of the core portion 355, wherein the sidewalls 353 are tilted to the first surface 101.

The liner portion 359 may passivate the auxiliary material at least against a sealing structure 490 encapsulating the bond wire or clip 410 and the bonding pad 300 and may be from or may contain, as main constituent, a stable barrier material such as titanium, tantalum or palladium, or gold. For example, the liner portion 359 may be combined with a core portion 355 containing at least one of Cu and Ag.

Figure 4A:
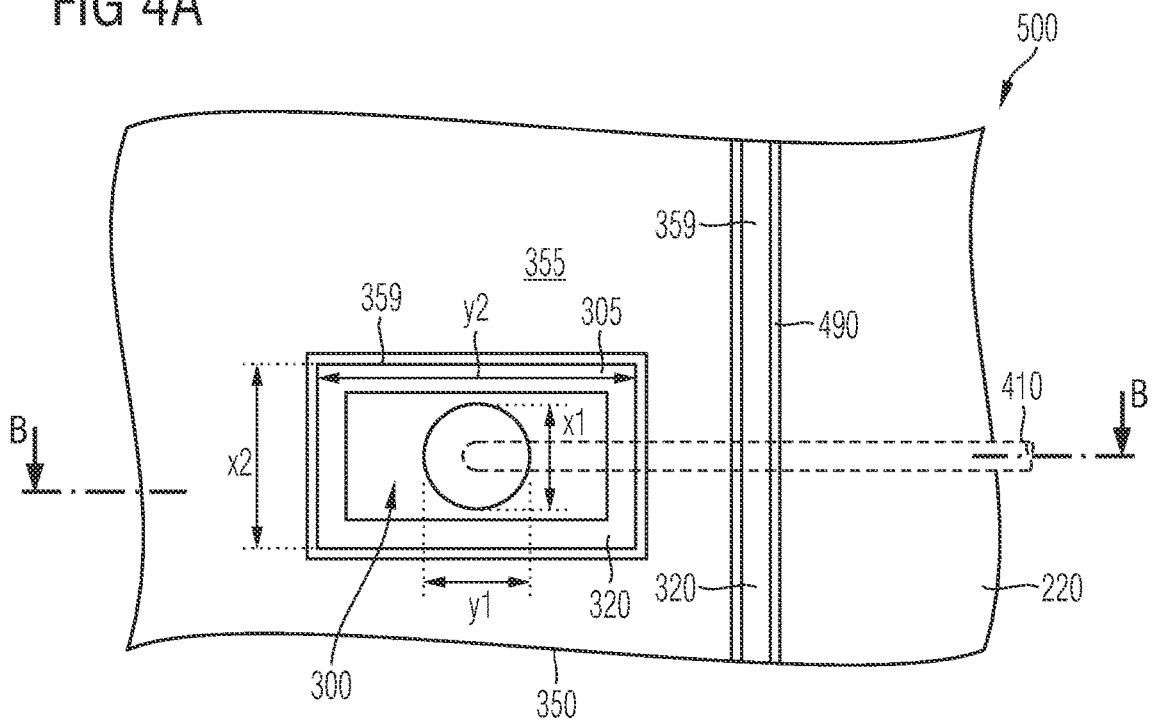
FIG. 4A is a schematic horizontal cross-sectional view of a portion of a semiconductor device according to an embodiment combining ball-bonding with a bonding pad including a supplemental structure directly between a base portion and a cap portion.
Figure 4B:
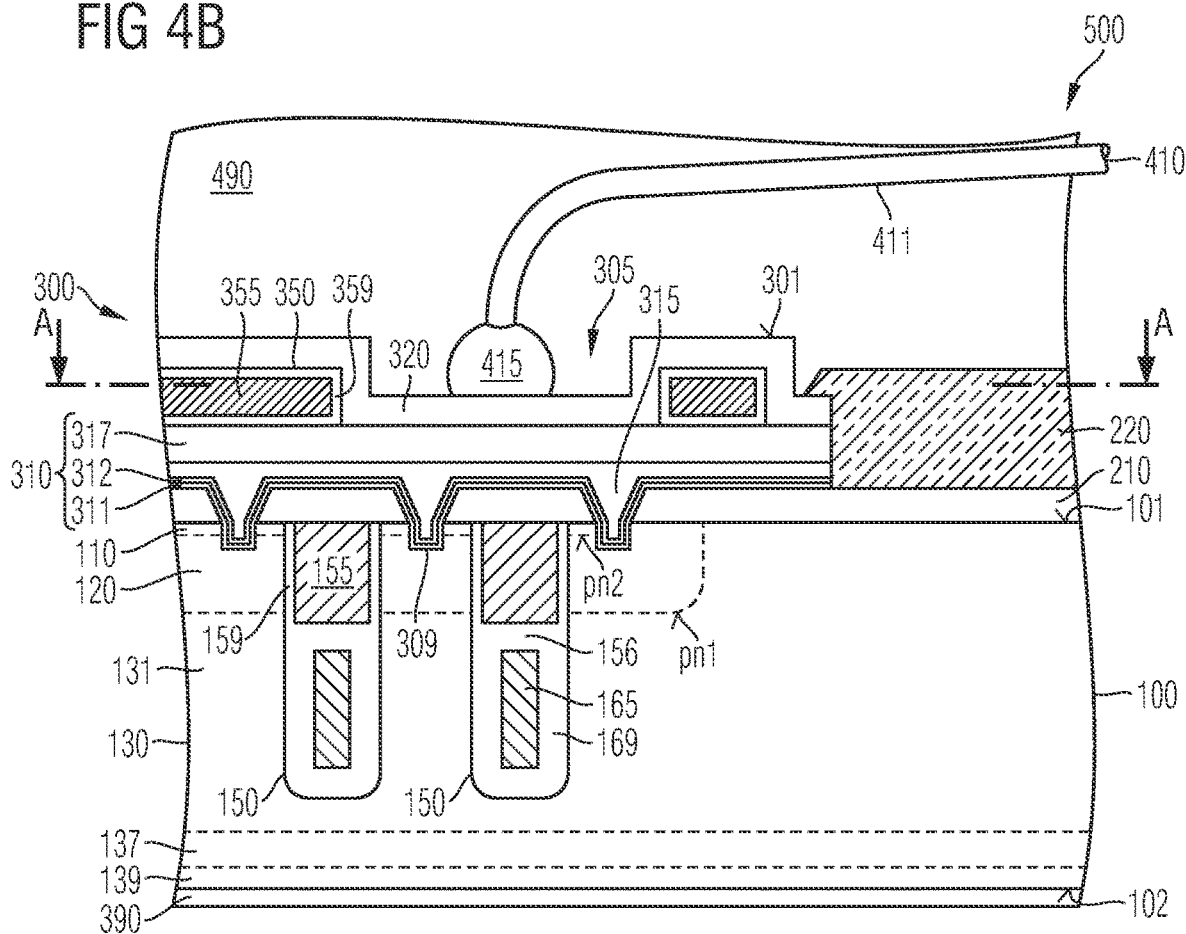
FIG. 4B is a vertical cross-sectional view of the semiconductor device portion of FIG. 4A.

FIGS. 4A and 4B combine ball-bonding with a supplemental structure 350, wherein the supplemental structure 350 is positioned between a cap portion 320 and a base portion 310 of a bonding pad 300 of a semiconductor device 500, wherein the semiconductor device includes trench gate structures 150 with a field plate electrode 165.

The trench gate structures 150 extend from the first surface 101 into the drift zone 131. The gate electrode 155 is formed in portions of the trench gate structures 150 oriented to the first surface 101. A gate dielectric 159 separates the gate electrode 155 from the semiconductor portion 100 and capacitively couples the gate electrode 155 to vertical channel portions of the body regions 120. Between the gate electrode 155 and the second surface 102, the trench gate structures 150 include a conductive field plate electrode 165. A field dielectric 169 separates the field plate electrode 165 from the drift zone 131 and a separation dielectric 156 separates the gate electrode 155 from the field plate electrode 165.

The bond foot 415 is formed from a melted portion on the tip of the bond wire or clip 410 and may have approximately elliptic horizontal and vertical cross-sectional areas with approximately equal first length y1 parallel to a longitudinal axis and first width x1 orthogonal to the longitudinal axis of the bond wire or clip 410.

The supplemental structure 350 may completely surround the bonding region 305 and may define a boundary of the bonding region 305. Outside the bonding region 305, the supplemental structure 350 may be positioned between a cap portion 320 and a base portion 310 of the bonding pad 300. The cap portion 320 may include a main cap portion of aluminum or an aluminum alloy such as AlCu, AlSi or AlSiCu.

The liner portion 359 may separate the core portion 355 of the supplemental structure 350 from both the base portion 310 and the cap portion 320.

In the bonding region 305 the cap portion 320 may directly adjoin the base portion 310 or idle sections of the liner portion 359 may be formed directly between the cap portion 320 and the base portion 310.

The core portion 355 may be from silver (Ag). A vertical extension of the core portion 355 may be in a range from 5 μm to 100 μm, for example in a range from 5 μm to 20 μm. The liner portion 359 may be from titanium (Ti), wherein the liner portion 359 is effective as an adhesive layer and suppresses the formation of silver dendrites. A thickness of the liner portion 359 may be in a range from 20 nm to 100 nm.

The supplemental structure 350 may extend across the complete blank region 306 of the bonding pad 300 outside the bonding region 305 and, optionally, outside the pad edge area 307 or may be formed exclusively in sub portions of the blank region 306 as illustrated in FIGS. 5A to 5D.

Figure 5A:
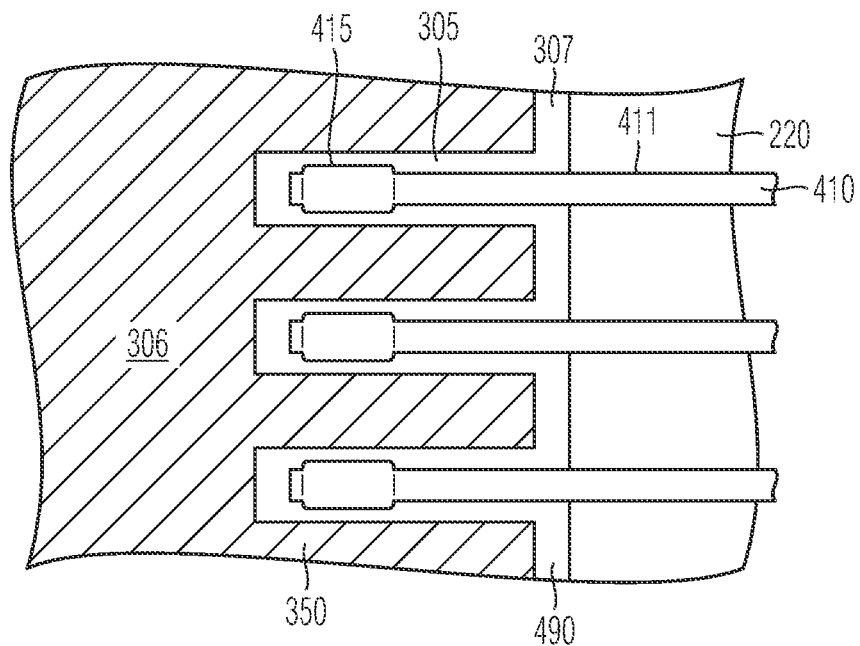
FIG. 5A is a schematic plan view of a portion of a semiconductor device according to an embodiment referring to a supplemental structure with slits in a vertical projection of the bond wires.

In FIG. 5A the supplemental structure 350 is formed in the complete blank region 306 except in the horizontal projection of the bonding region 305 into direction of the loop portions 411 such that the supplemental structure 350 shows slits, which are open in the vertical projection of the bond wire or clips 410.

Figure 5B:
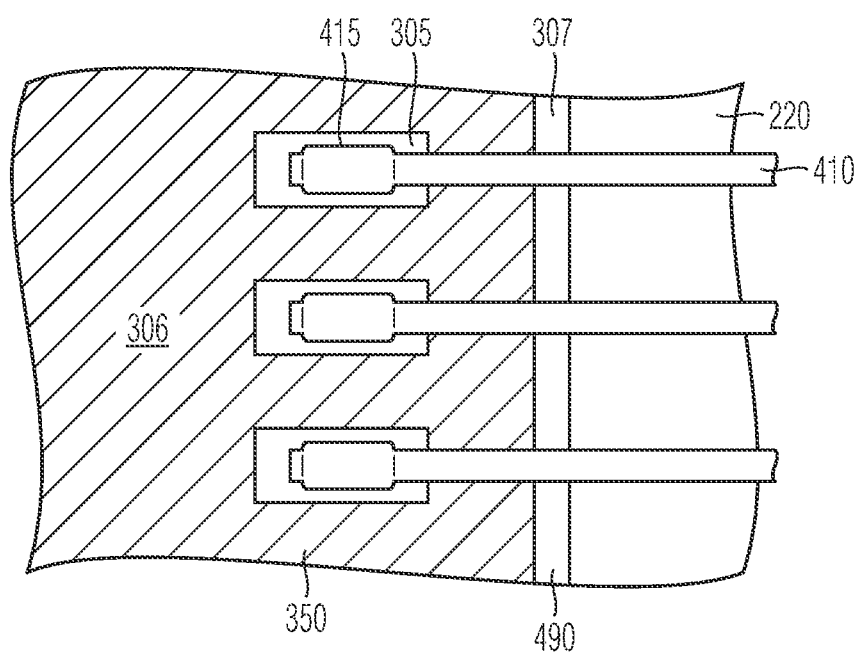
FIG. 5B is a schematic plan view of a portion of a semiconductor device according to an embodiment concerning a supplemental structure with openings.

In FIG. 5B the supplemental structure 350 covers the complete blank region 306 outside both the pad edge area 307 and the bonding regions 305.

Figure 5C:
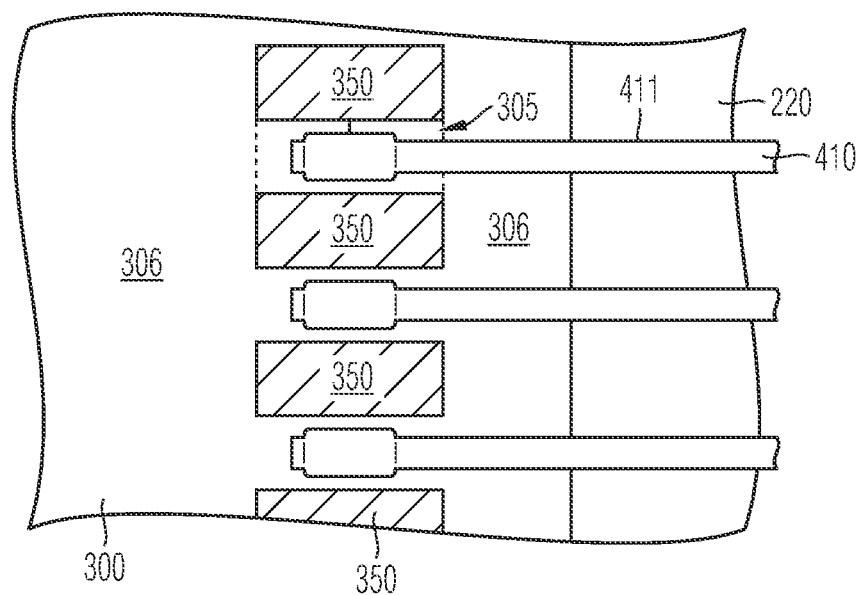
FIG. 5C is a schematic plan view of a portion of a semiconductor device according to an embodiment concerning a supplemental structure with separated pad sections between neighboring bond feet.

In FIG. 5C the supplemental structure 350 includes several separated portions at opposite sides of bonding feet 415, wherein the separated portions of the supplemental structure 350 are formed in a direction orthogonal to the longitudinal axis of the bond wire or clip 410.

Figure 5D:
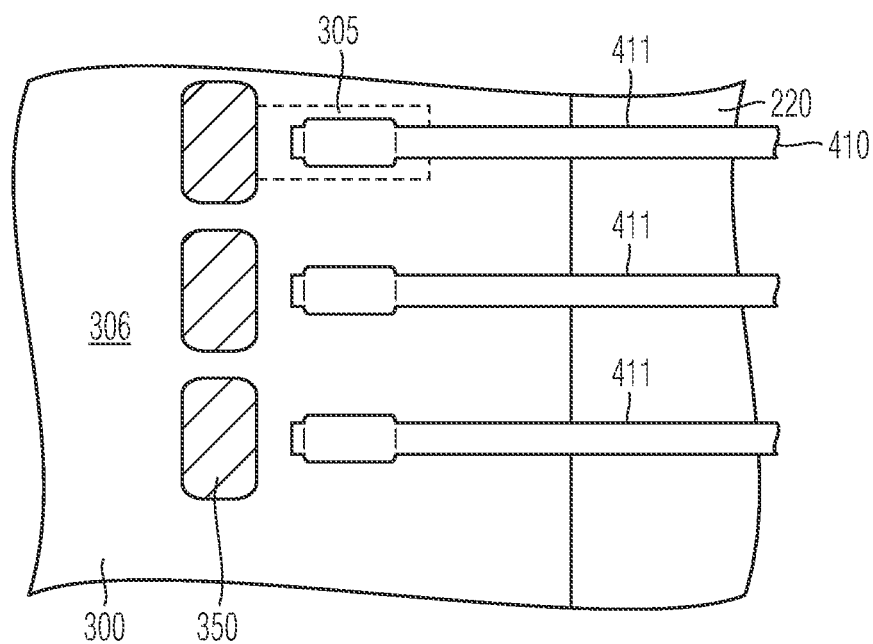
FIG. 5D is a schematic plan view of a portion of a semiconductor device according to an embodiment concerning a supplemental structure with separated pad sections in the longitudinal projection of the bond wires.

In FIG. 5D the supplemental structure 350 includes separated or interconnected portions in the horizontal projection of the bond wire or clips 410 at a side opposite of the loop portion 411.

FIGS. 5A to 5D mainly concern supplemental structures 350 that may be formed before wire bonding. The following FIGS. 6A to 6C mainly concern supplemental structures 350 formed after wire bonding.

FIG. 6A schematically shows a semiconductor device 500 with a semiconductor die 501, which includes a semiconductor portion 100 and a bonding pad 300 forming a source electrode, and a lead assembly 710 in a typical package for discrete devices like, e.g., the TO-220 (transistor outline) package or similar. The lead assembly 710 may include a gate lead 715, a source lead 711 and a drain lead 712 formed from a common lead frame by mechanically separating the gate lead 715 and the source lead 711 from the drain lead 712, e.g., during the packaging process.

The semiconductor die 501 may be soldered with the rear side down onto a portion of the lead assembly 710 forming the drain lead 712. A first bond wire or clip 410 electrically connects a gate pad 380 at the front side of the semiconductor die 501 with the gate lead 715. One, two or more second bond wire or clips 410 may electrically connect the bonding pad 300 with the source lead 711. A supplemental structure 350 may be applied through a dispenser tip mainly close to but separated from the bonding feet 415 of the bond wire and clips 410 and between the end portions of the second bond wire and clips 410. Alternatively, the supplemental structure 350 may be in contact with the bond wire and clips 410 and may partially or completely cover the bonding feet 415.

Figure 6B:
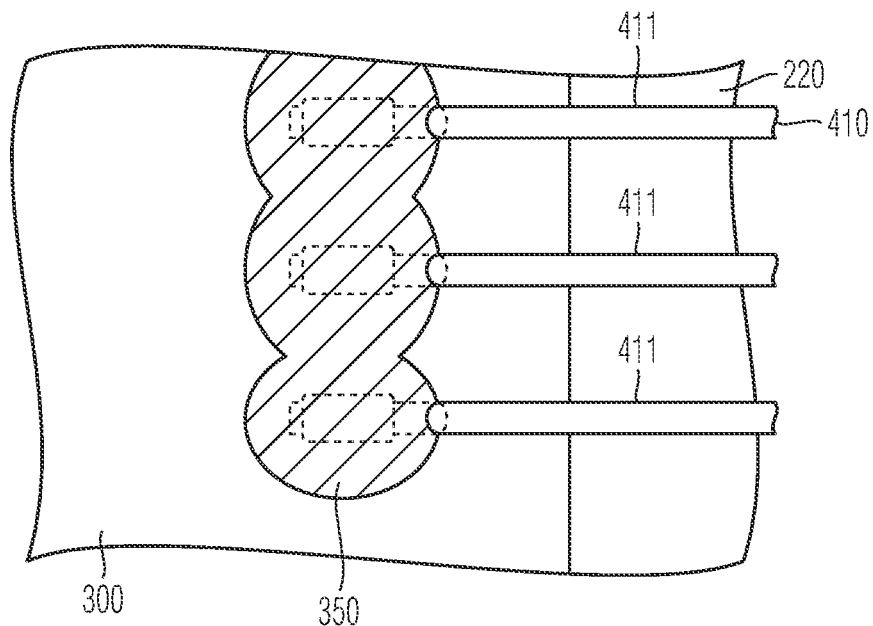
FIG. 6B is a schematic plan view of a portion of a semiconductor device according to an embodiment referring to a supplemental structure formed after wire bonding.

In FIG. 6B a dispenser tip may form the supplemental structure 350, wherein the dispenser tip may be positioned directly on or in close proximity to the bonding feet 415 of the bond wire or clips 410, e.g., between neighboring bonding feet 415 such that the supplemental structure 350 is in direct contact with the bonding feet 415. According to the illustrated embodiment one continuous supplemental structure 350 enwraps portions of several bond wire or clips 410 including the bonding feet 415.

Figure 6C:
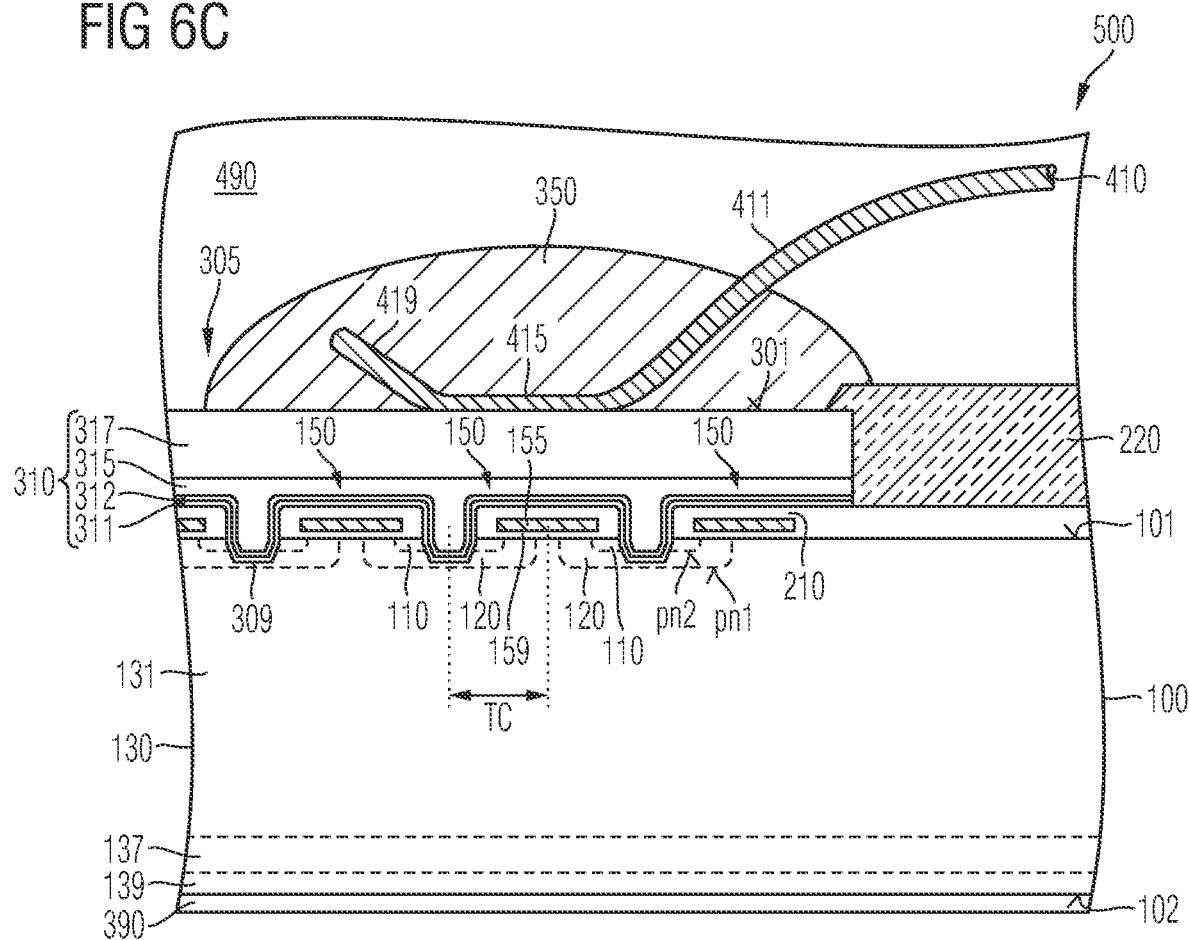
FIG. 6C is a schematic vertical cross-sectional view of a portion of a semiconductor device according to an embodiment concerning a supplemental structure enwrapping a bonding foot.

The semiconductor device 500 of FIG. 6C differs from the one in FIGS. 2A to 2B in that the supplemental structure 350 is formed after wire bonding, wherein the supplemental structure 350 may mainly be formed in the bonding region 305. The supplemental structure 350 may be in direct contact with the bonding foot 415 and may partially or completely wrap around an adjoining section of the loop portion 411 of the bond wire or clip 410 as well as around the tail portion 419. In case of ball bonding, the supplemental structure 350 may wrap around at least a portion of the spherical bonding foot 415. The supplemental structure 350 may be spaced from the intermetal dielectric 220 or may overlap with the intermetal dielectric 220 as illustrated.

Figure 7C:
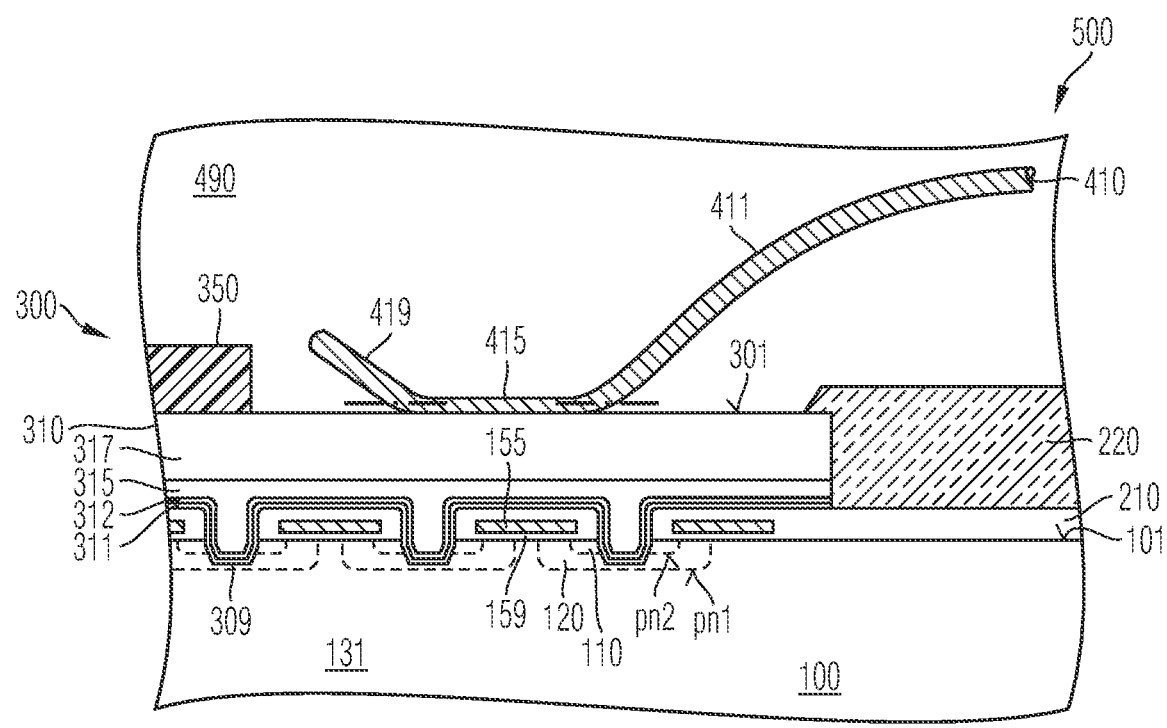
FIG. 7C is a schematic vertical cross-sectional of a portion of a semiconductor device obtained from the semiconductor substrate portion of FIG. 7B, after sealing a semiconductor die in a protective enclosure.

FIGS. 7A to 7C refer to a method of forming a bonding pad 300 with a supplemental structure 350 with the supplemental structure 350 formed at wafer level.

FIG. 7A shows a portion of one semiconductor die of a plurality of semiconductor dies formed in device regions 610 of a semiconductor wafer 900, for example, a silicon wafer. Each semiconductor die may include transistor cells TC and at least a base portion 310 of a bonding pad electrically connected with source zones 110 and body regions 120 in a semiconductor portion 100 of the semiconductor die. An intermetal dielectric 220 may separate neighboring bonding pads 300, for example, bonding pads 300 of source electrodes of neighboring device regions 610 or the bonding pads 300 for source electrode and gate electrode of the same device region 610.

A supplemental layer may be deposited on top of the base portion 310 and on the intermetal dielectric 220, e.g., by screen printing or stencil printing of, e.g., a phenolic resin. According to another embodiment, the supplemental layer is patterned by photolithography, wherein the supplemental layer may be from nickel, nickel oxide, a nickel alloy, tungsten carbide, tungsten, molybdenum or silver, by way of example.

For example, a resist layer may be deposited onto the supplemental layer. The resist layer is patterned by a masked exposure to a radiation at a wavelength at which photosensitive groups of the resist material are modified and a removal or development process selectively removes either the modified portions or the unmodified portions of the resist layer. Then the pattern of the resist layer is imaged into the underlying supplemental layer. Remnants of the patterned photoresist mask are removed.

According to another embodiment the supplemental structure 350 is from a phenolic resin, wherein the phenolic resin may be modified by adding photoactive groups such that the supplemental structure 350 can be directly patterned by photolithography.

FIG. 7B shows a supplemental structure 350 obtained by patterning the supplemental layer. The supplemental structure 350 covers sections of the base portions 310 of bonding pads 300 in the device regions 610. The supplemental structure 350 exposes bonding regions 305 of the main surface 301 of the bonding pads 300.

The semiconductor wafer 900 is diced, wherein the semiconductor dies are separated from each other. Each semiconductor die may be attached, e.g., to a lead frame and the bonding pads 300 of each semiconductor die are electrically connected to leads of the lead frame through wire-bonding. Then the semiconductor die and the bond wire or clips 410 are sealed with a molding compound encapsulating the semiconductor die, the bond wire or clips 410 and portions of the lead frame.

FIG. 7C shows a semiconductor device 500 including a sealing structure 490 enclosing the bond wire or clip 410 and the semiconductor die with the semiconductor portion 100 and the bonding pad 300.

Figure 8A:
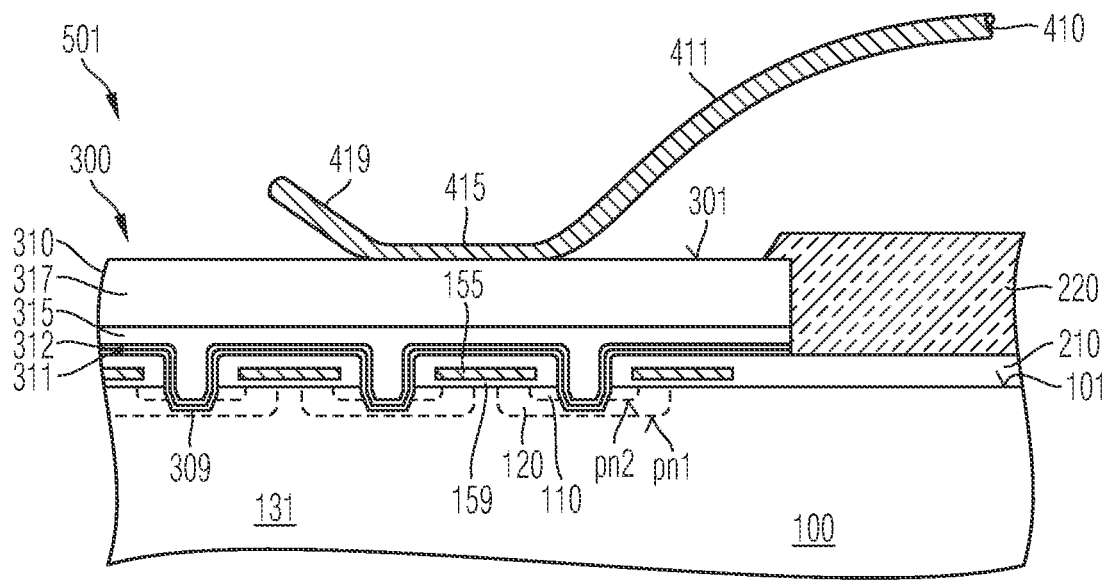
FIG. 8A is a schematic cross-sectional view of a portion of a semiconductor device for illustrating a method of manufacturing semiconductor devices according to an embodiment forming the supplemental structure after wire-bonding.
Figure 8B:
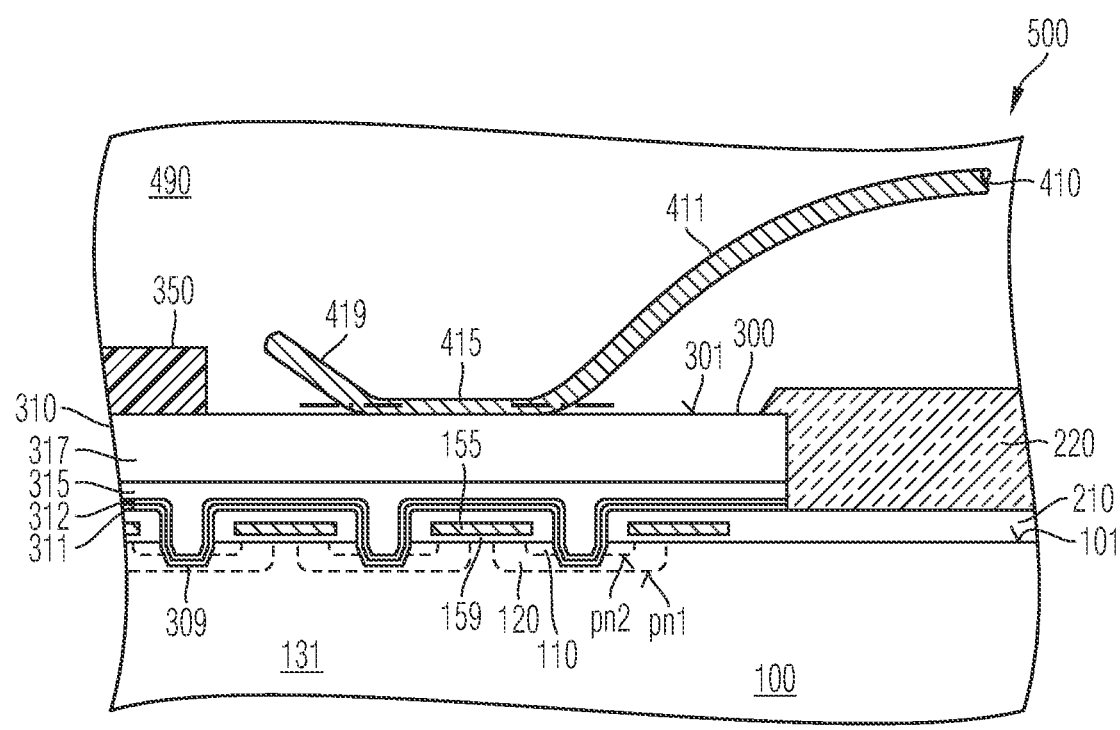
FIG. 8B is a schematic vertical cross-sectional of the semiconductor device portion of FIG. 8A, after sealing the semiconductor device in a protective enclosure.

FIGS. 8A to 8B refer to a method applying the supplemental structure 350 on device level after die-bonding, wherein die-bonding may include soldering, adhesive bonding or sintering.

A semiconductor die 501 is formed by dicing a semiconductor wafer 900 without supplemental structure 350 as illustrated in FIG. 7A. A bonding pad 300 of the semiconductor die 501 is wire-bonded to a lead of a lead frame.

FIG. 8A shows a bond wire or clip 410 wire-bonded onto a main surface 301 of a bonding pad 300. A supplemental structure 350 may be stencil printed or screen printed prior to the wire bonding process. After the bonding process, the supplemental structure 350 may be dispensed through a dispenser tip in a blank region 306 of the main surface 301 of the bonding pad 300. A sealing process forms a sealing structure 490 encapsulating the semiconductor die 501, portions of the leads and the bond wire or clips 410.

FIG. 8B shows the supplemental structure 350, which may be, by way of example from phenolic resin.

Figure 10:
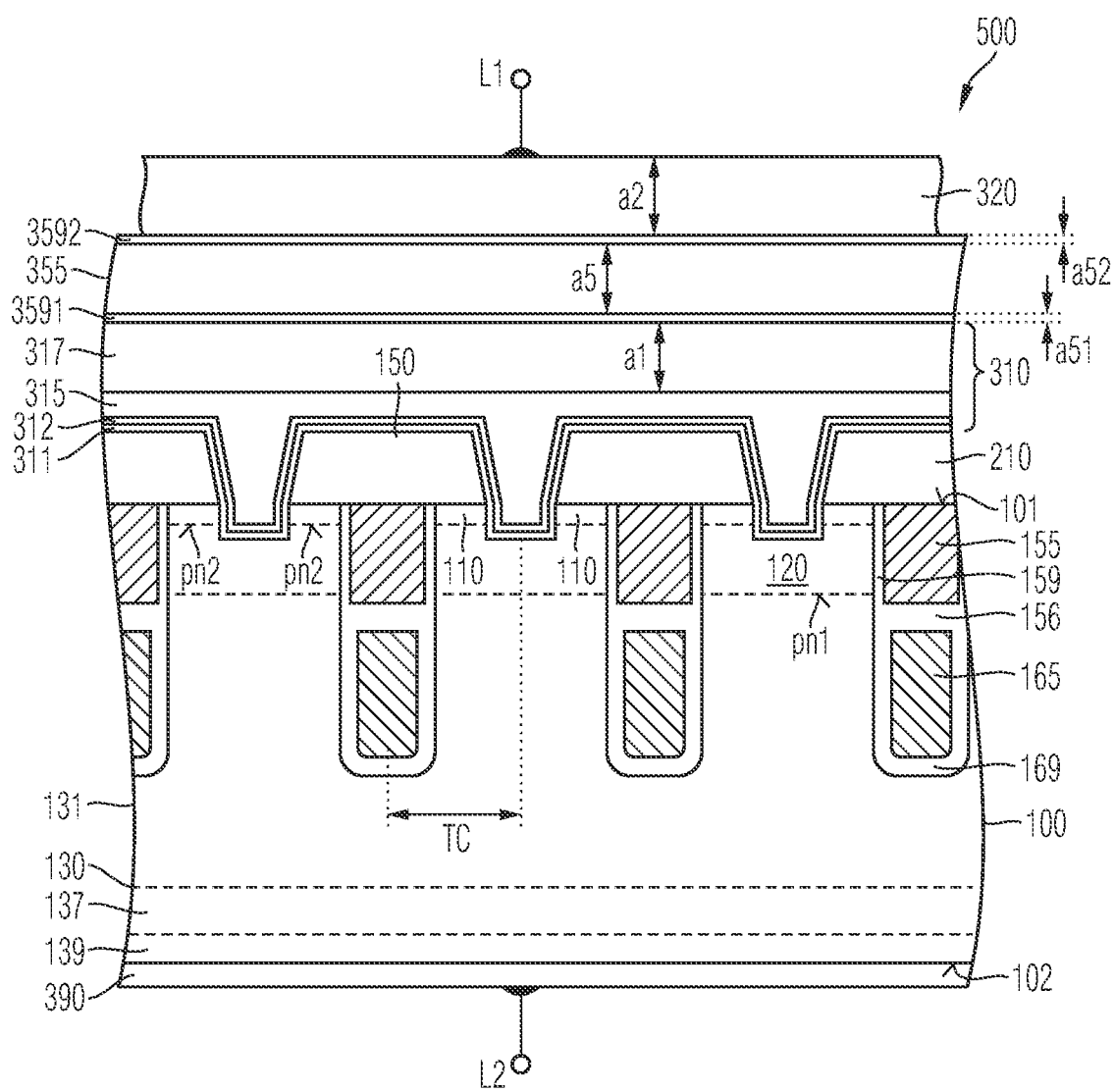
FIG. 10 is a schematic cross-sectional view of a portion of a semiconductor device with a bonding pad including a core portion containing silver according to an embodiment including a cap portion from an aluminum alloy.
Figure 11:
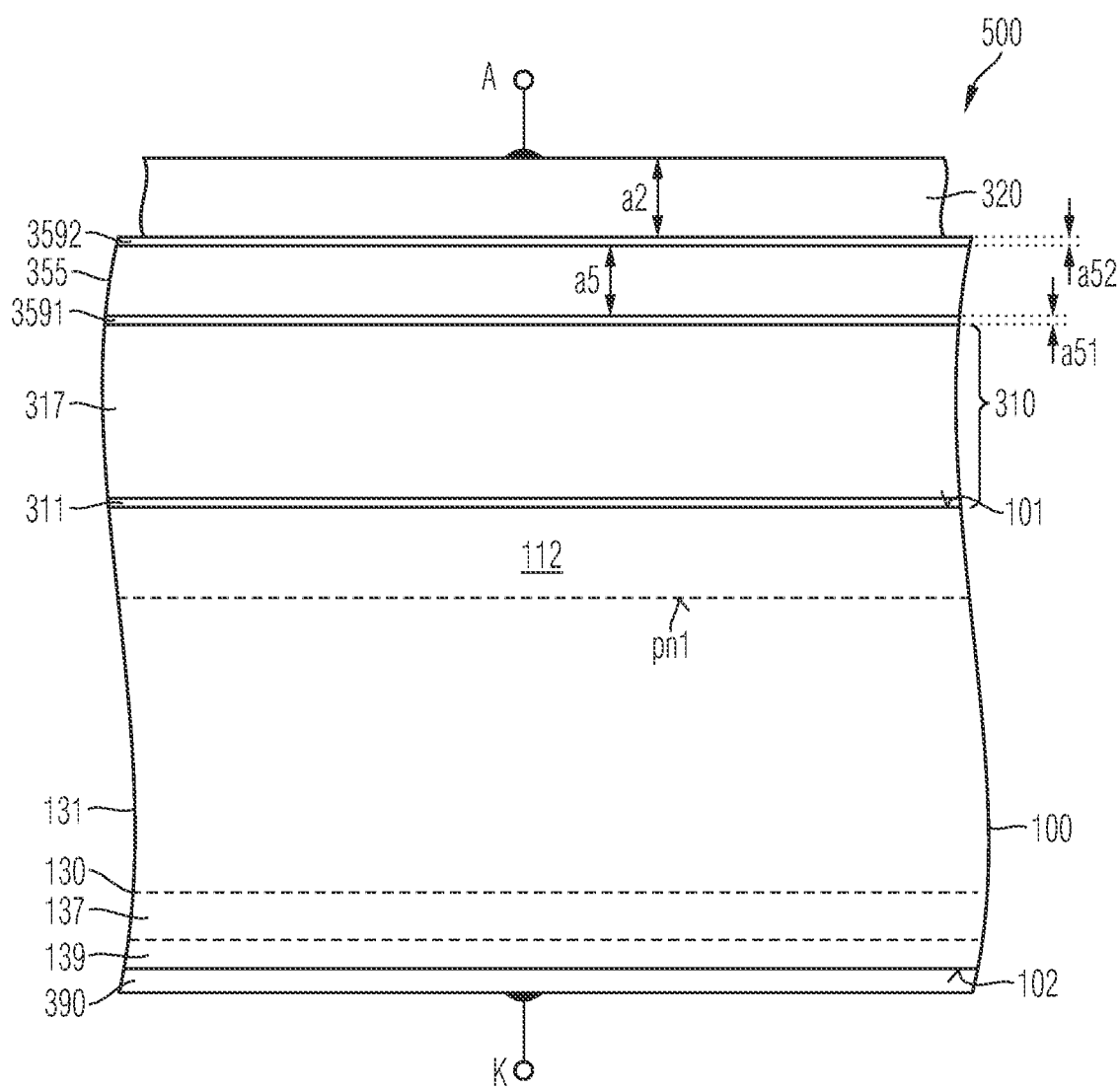
FIG. 11 is a schematic vertical cross-sectional view of a portion of a semiconductor device with a bonding pad including a core portion containing silver according to an embodiment referring to semiconductor diodes.

In FIGS. 9 to 11 the bonding pad 300 includes a supplemental structure 350 with a core portion 355 that may be formed independently from the presence of a bonding region 305 as described in the previous embodiments.

FIG. 9 refers to a semiconductor device 500 with a plurality of transistor cells TC electrically connected in parallel and with planar gate structures 150 as described above with reference to FIG. 2B. A base portion 310 of a bonding pad 300 may include a contact layer 311, a barrier layer 312, a fill layer 315 and a base layer 317 from aluminum or an aluminum alloy as described above with reference to FIGS. 2A and 2B.

A supplemental structure 350 is formed directly on the base portion 310. The supplemental structure 350 includes a core portion 355 from silver or from a material which main constituent is silver. The supplemental structure 350 may extend across the complete top surface of the base portion 310 or across sub regions of the top surface. The bonding pad 300 may be electrically connected to further conductive structures through press contacts, soldered contacts or bond wires in regions of the bonding pad 300 with or without supplemental structure 350.

A vertical extension a5 of the core portion 355 may be in a range from 5 μm to 100 μm, for example from 5 μm to 20 μm. A first liner portion 3591 may be formed directly between the core portion 355 and the base portion 310. The first liner portion 3591 improves adhesion between the base portion 310 and the core portion 355. A vertical extension a51 of the first liner portion 3591 may be, e.g., in a range from 20 nm to 100 nm. The first liner portion 3591 may be from or may include at least one of titanium and tantalum and also suppresses the formation of silver dendrites along the interface to the core portion 355.

A second liner portion 3592 may cover a horizontal top surface 351 of the core portion 355. The second liner portion 3592 may be an oxidation protection layer, for example, from gold (Au), aluminum (Al) or an aluminum alloy such as AlCu, AlSi or AlSiCu.

The supplemental structure 350 with the core portion 355 from silver increases the mechanical strength of the bonding pad 300 and protects the semiconductor portion 100 from mechanical stress exerted on the bonding pad 300 during wire-bonding. The supplemental structure 350 including the core portion 355 from silver can fully replace a thick copper layer typically provided to the same purpose.

Copper has a high diffusion coefficient in semiconductors like silicon, and also diffuses easily through other metal layers such as tungsten, aluminum, aluminum alloys such as AlCu and AlSiCu. A contamination of the semiconductor portion 100 of a semiconductor device with copper has adverse impact on device characteristics and device reliability. Therefore, conventionally a diffusion barrier layer between the semiconductor portion 100 and the copper metallization prevents copper atoms from diffusing from the copper metallization into the semiconductor portion 100.

Diffusion barriers are comparatively thin and therefore prone to formation of cracks, loopholes and leaks. But even perfect diffusion barriers without cracks, leaks and loopholes are still permeable for copper atoms to some degree.

In addition, a comparatively thick copper metallization exerts significant thermomechanical strain both on a semiconductor wafer during processing and on a semiconductor portion in the finalized semiconductor device.

In silicon the diffusion coefficient of silver in silicon is significantly lower than the diffusion coefficient of copper by about five orders of magnitude and any significant diffusion of silver takes place only at temperatures above 700° C., whereas copper diffuses at temperatures within the nominal operating range of common semiconductor devices below 175° C.

As a result, a bonding pad 300 in which a supplemental structure 350 with a core portion 355 from silver replaces a copper metallization gets along without expensive diffusion barrier liner and results in significantly increased long-term device reliability compared to a bonding pad including a copper layer.

The semiconductor device 500 of FIG. 10 combines transistor cells TC with trench gate structures 150 including a field plate electrode 165 as described with reference to FIGS. 4A to 4B with a bonding pad 300 including a silver layer.

The bonding pad 300 includes a cap portion 320, which may include or consist of a main cap layer of aluminum or an aluminum alloy such as AlCu, AlSiCu or AlSi. A thickness a2 of the cap portion 320 may be in a range from 2 μm to 200 μm. The cap portion 320 and the base portion 310 as described with reference to FIGS. 2A and 2B sandwich the supplemental structure 350.

The supplemental structure 350 includes a core portion 355 from silver or from a material containing silver as main constituent, a first liner portion 3591 formed directly between the core portion 355 and the base portion 310 and a second liner portion 3592 formed directly between the cap portion 320 and the core portion 355. A thickness a52 of the second liner portion 3592 may be the same as or may be within the same range as the thickness of a51 of the first liner portion 3591. Both the first and the second liner portions 3591, 3592 may be from tantalum and/or titanium.

In FIG. 11 the semiconductor device 500 is a power semiconductor diode with the base portion 310 of the bonding pad 300 in direct contact with a horizontal first surface 101 of the semiconductor portion 100.

Figure 12A:
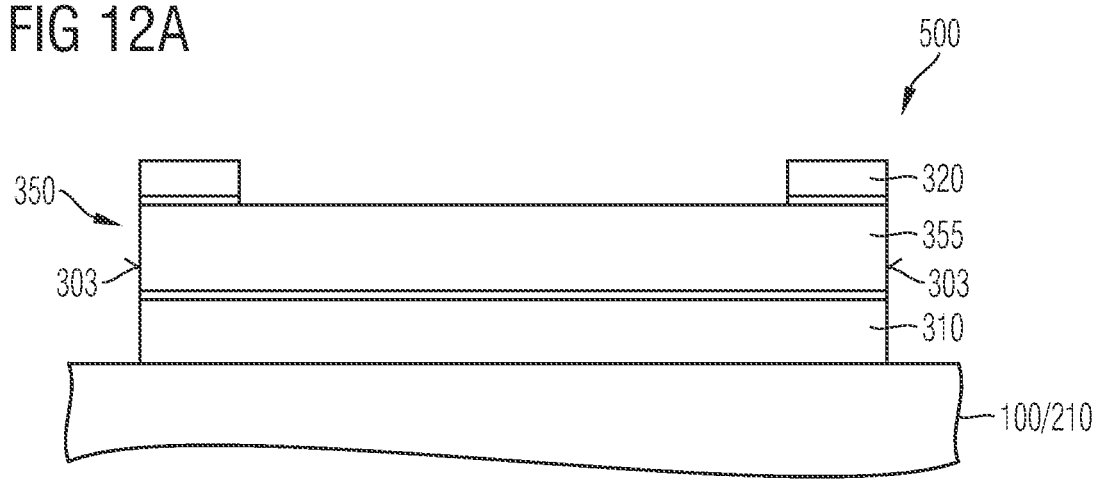
FIG. 12A is a schematic vertical cross-sectional view of a portion of a semiconductor device according to an embodiment with a cap portion of a bonding pad exclusively formed along an lateral outer surface of the bonding pad.
Figure 12B:
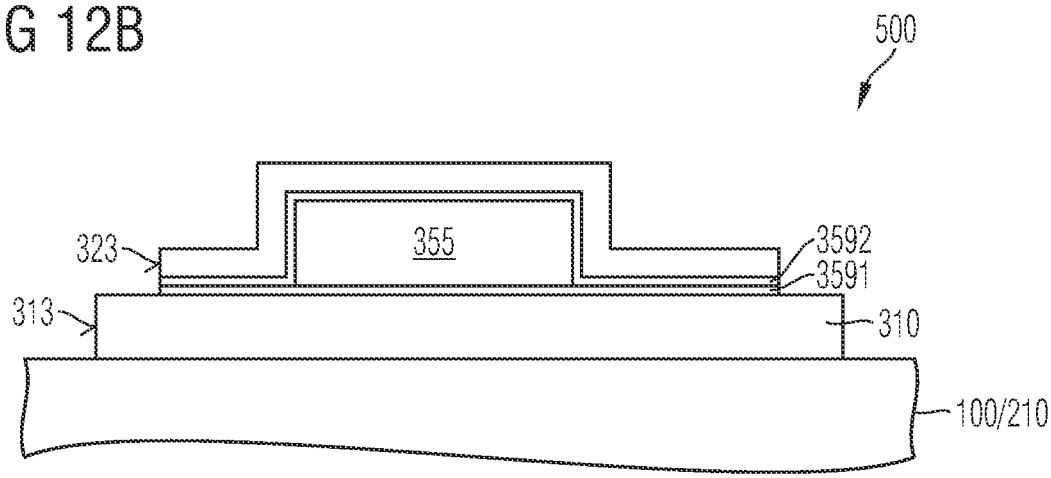
FIG. 12B is a schematic vertical cross-sectional view of a portion of a semiconductor device according to an embodiment with a cap portion formed independently from a base portion of the bonding pad.
Figure 12C:
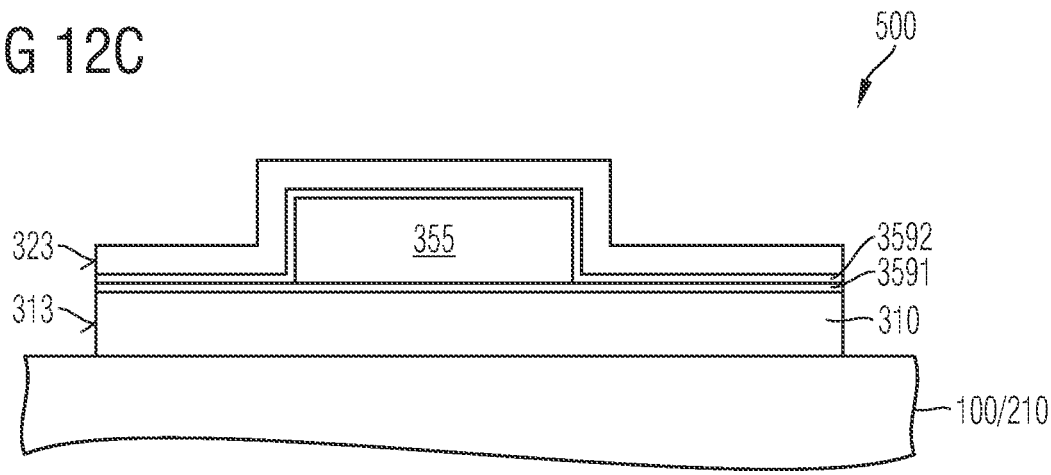
FIG. 12C is a schematic vertical cross-sectional view of a portion of a semiconductor device according to an embodiment with the cap portion and the base portion of the bonding pad patterned in the same process.

FIGS. 12A to 12C refer to partially patterned bonding pads 300.

In FIG. 12A the supplemental structure 350 extends across the complete horizontal cross-sectional area of the bonding pad 300. The cap portion 320 is exclusively formed in a pad edge region along the lateral outer surface 303 of the bonding pad 300. The cap portion 320 is absent in a central portion of the bonding pad 300, where the supplemental structure 350, e.g., the core portion 355 is exposed. The cap portion 320 suppresses oxidation and the formation of dendrites. The exposed supplemental structure 350 allows sintering or a press contact at the front side of the semiconductor device 500.

Young's modulus of silver is 82.7 GPa, which is significantly lower than Young's modulus of copper, which is 130 GPa such that the thermomechanical stress exerted by the core portion 355 from silver is significantly lower than the thermomechanical stress exerted by a solid copper structure of the same vertical extension.

In FIG. 12B the supplemental structure 350 is exclusively formed in a central portion of the bonding pad 300. The lateral outer surface 323 of the cap portion 320 is pulled back with respect to a lateral outer surface 313 of the base portion 310 of the bonding pad. Outside a vertical projection of the core portion 355 the base portion 310 and the cap portion 320 may sandwich idle portions of the first and/or second liner portion 3591, 3592. According to other embodiments, the cap portion 320 may directly adjoin the base portion 310 outside a vertical projection of the core portion 355.

In FIG. 12C the lateral outer surface 313 of the base portion 310 is coplanar with the lateral outer surface 323 of the cap portion 320. For further details, reference is made to the description of FIG. 12B.

Figure 13A:
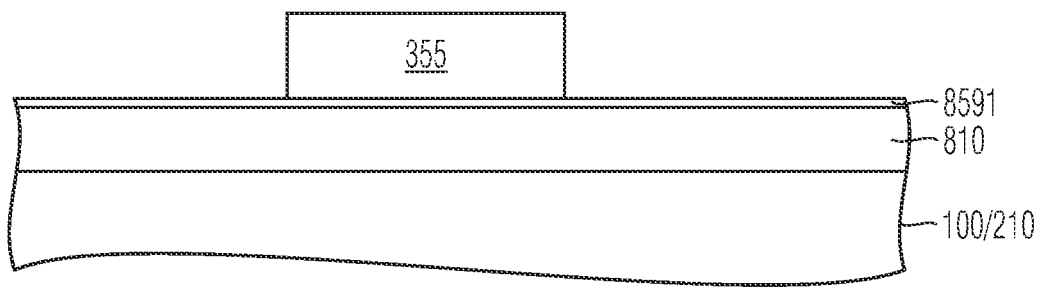
FIG. 13A is a schematic vertical cross-sectional view of a portion of a semiconductor substrate for illustrating a method of forming a bonding pad with a supplemental structure with a core portion from silver according to an embodiment with a cap portion and a base portion formed in the same patterning step, after patterning the core portion of the supplemental structure.
Figure 13B:
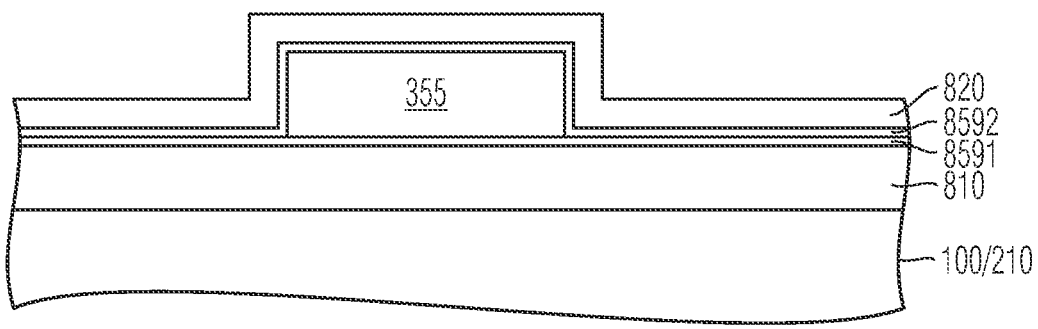
FIG. 13B is a schematic vertical cross-sectional view of the semiconductor substrate portion of FIG. 13A, after forming a capping layer.
Figure 13C:
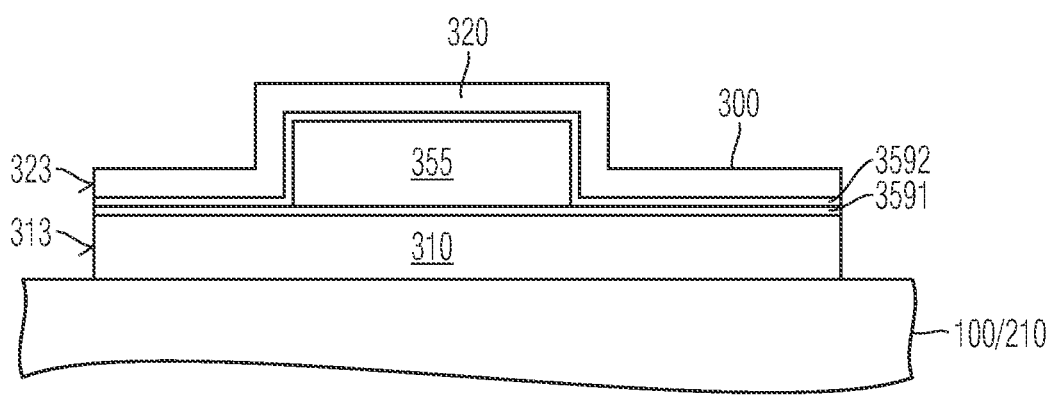
FIG. 13C is a schematic vertical cross-sectional view of the semiconductor substrate portion of FIG. 13B, after patterning the cap layer and a base layer.

FIGS. 13A to 13C refer to a method of patterning the cap portion 320 and the base portion 310 in the same patterning step.

A base layer stack 810 that may include a contact layer, a barrier layer, a fill layer and an aluminum-containing layer as described above may be deposited on a first surface 101 of a semiconductor portion 100 or onto an interlayer dielectric 210 with openings that expose contact sections of the semiconductor portion 100. A first supplementary layer 8591, e.g., from titanium or tantalum is deposited on the base layer stack 810. A silver layer is deposited on the first supplementary layer 8591 and patterned by photolithography, for example, by a wet etch using an aqueous mixture of $HNO_3$ and $H_3PO_4$.

In FIG. 13A the patterned core portion 355 formed from the silver layer covers a central portion of the base layer 810. In the illustrated embodiment, the first supplementary layer 8591 is patterned contemporaneously with silver layer. According to other embodiments, exposed portions of the first supplementary layer 8591 may be removed in a dry etch process or by a wet etch using a low-concentrated HF, for example, a 0.1% HF.

A second supplementary layer 8592 and a capping layer stack 820 may be successively deposited, wherein the capping layer stack 820 is directly formed on the second supplementary layer 8592.

FIG. 13B shows a conformal capping layer stack 820, which may include an aluminum-containing layer, that covers the core portion 355 encapsulated by the first and second supplementary layers 8591, 8592. Then the bonding pad 300 may be formed by a dry etch process or by a sequence of wet etch processes using different etch solutions but the same etch mask.

FIG. 13C shows the bonding pad 300 with a base portion 310 formed from a portion of the base layer stack 810 of FIG. 13B, a cap portion 320 formed from a remnant portion of the capping layer stack 820 of FIG. 13B, a first liner portion 3591 and a second liner portion 3592. A lateral outer surface 323 of the cap portion 320 and a lateral outer surface 313 of the base portion 310 are coplanar.

Figure 14A:
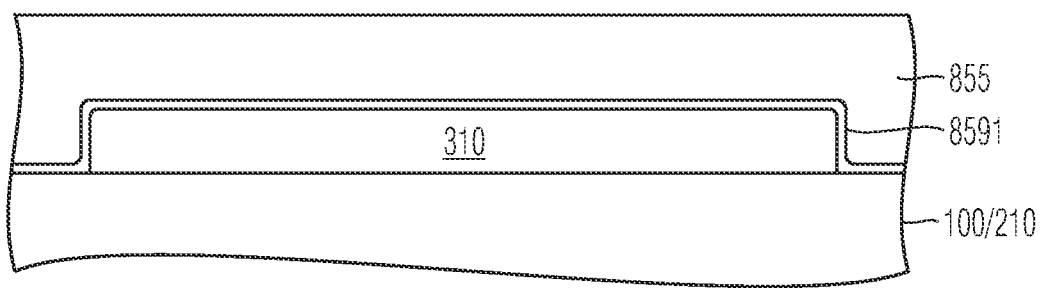
FIG. 14A is a schematic vertical cross-sectional view of a portion of a semiconductor device for illustrating a method of manufacturing semiconductor devices according to an embodiment patterning a cap portion and a base portion of the bonding pad independently from each other, after forming a core layer.
Figure 14B:
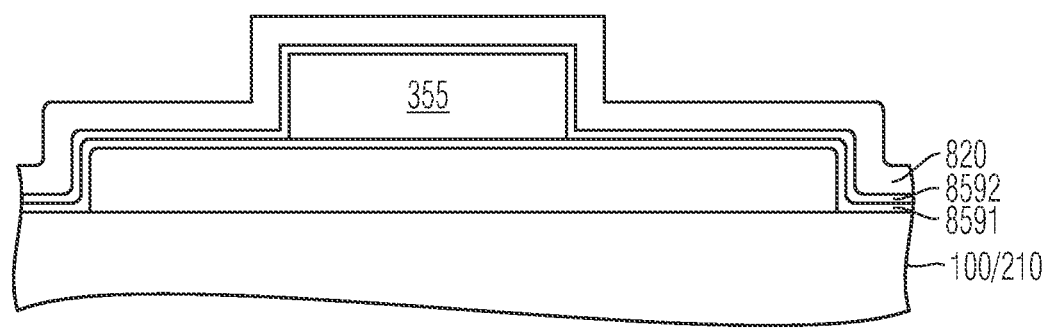
FIG. 14B is a schematic vertical cross-sectional view of the semiconductor substrate portion of FIG. 14A, after forming a capping layer.
Figure 14C:
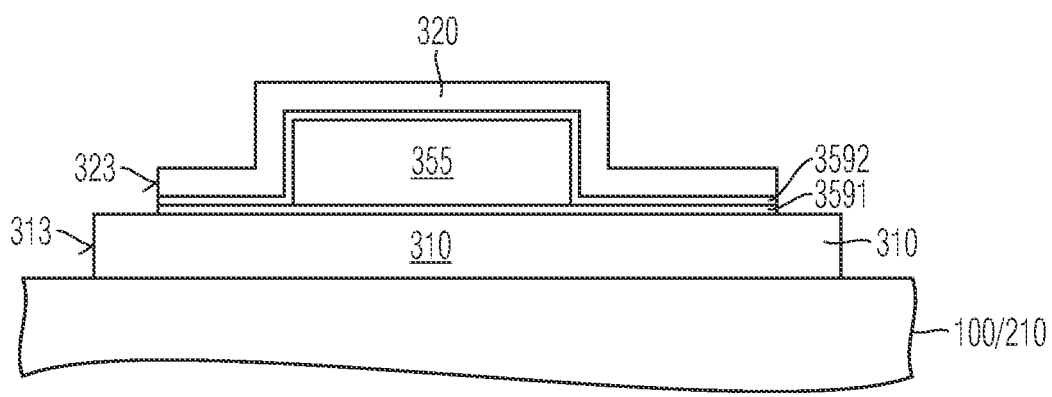
FIG. 14C is a schematic vertical cross-sectional view of the semiconductor substrate portion of FIG. 14B, after patterning the cap layer.

FIGS. 14A to 14C concern a method with a base portion 310 and a cap portion 320 of a bonding pad 300 formed in different patterning processes.

A base layer stack is deposited and patterned to form a base portion 310. A first supplementary layer 8591 may be deposited on the patterned base portion 310. A silver layer 855 is deposited on the first supplementary layer 8591.

FIG. 14A shows the silver layer 855 covering the base portion 310. The silver layer 855 is patterned by a dry etch or wet etch using an aqueous mixture of $HNO_3$ and $H_3PO_4$, by way of example. A second supplementary layer 8592 is deposited on the patterned core portion 355 obtained from the silver layer 855. A capping layer stack 820 is deposited on the second supplementary layer 8592.

FIG. 14B shows the capping layer stack 820 covering the core portion 355 and the base portion 310. A second wet etch process may remove portions of the capping layer stack 820 in a distance to the core portion 355.

As illustrated in FIG. 14C a lateral outer surface 323 of the cap portion 320 obtained from the capping layer stack 820 of FIG. 14B is pulled back with respect to a lateral outer surface 313 of the base portion 310.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A method of manufacturing a semiconductor device, the method comprising:
   forming a base portion of a bonding pad on a semiconductor portion, the base portion further comprising a base layer;
   forming a main surface of the bonding pad, the main surface comprising a bonding region;
   bonding a bond wire or clip to the bonding region; and
   forming a supplemental structure directly on the base portion, wherein the supplemental structure laterally adjoins the bond wire or clip or is laterally spaced apart from the bond wire or clip, and wherein a volume-related specific heat capacity of the supplemental structure is higher than a volume-related specific heat capacity of the base layer.

2. The method of claim 1, wherein the supplemental structure is formed before the bonding of the bond wire or clip to the bonding region.

3. The method of claim 2, wherein the supplemental structure is formed by screen printing.

4. The method of claim 2, wherein the supplemental structure is formed by stencil printing.

5. The method of claim 2, wherein the supplemental structure is formed by photolithography.

6. The method of claim 1, wherein the supplemental structure is formed after the bonding of the bond wire or clip to the bonding region.

7. The method of claim 6, wherein the supplemental structure is locally applied on the base portion through a dispenser.

8. The method of claim 6, wherein the supplemental structure directly contacts the bond wire or clip.

9. The method of claim 1, further comprising:
forming a cap portion of the bonding pad,
wherein the supplemental structure is positioned between the cap portion and the base portion.

10. The method of claim 1, further comprising:
forming a sealing structure which at least party encapsulates the bond wire or clip,
wherein the supplemental structure is positioned between the sealing structure and the bonding pad, and
wherein the volume-related specific heat capacity of the supplemental structure is higher than a volume-related specific heat capacity of the sealing structure.

11. The method of claim 10, wherein the sealing structure comprises at least one of a silicone gel and an epoxy resin.

12. The method of claim 10, wherein the sealing structure separates the supplemental structure from the bond wire or clip.

13. The method of claim 1, wherein forming the supplemental structure comprises:
forming a core portion which contains an auxiliary material with a volume-related specific heat capacity higher than copper.

14. The method of claim 13, wherein the auxiliary material is a metal-containing material.

15. The method of claim 14, wherein the metal-containing material comprises nickel, nickel oxide, a nickel alloy, cobalt, silver, tungsten carbide, topaz and/or lithium fluoride.

16. The method of claim 13, wherein the auxiliary material comprises phenolic resin.

17. The method of claim 13, wherein the supplemental structure comprises a liner portion encapsulating the core portion.

18. The method of claim 13, wherein the core portion of the supplemental structure comprises silver, and wherein forming the supplemental structure further comprises:
forming a liner portion which separates the core portion of the supplemental structure from the base portion of the bonding pad.

19. The method of claim 18, wherein the bonding pad comprises a cap portion and the supplemental structure is positioned between the base portion and the cap portion, and wherein forming the liner portion of the supplemental structure comprises:
forming a first liner portion separating the core portion of the supplemental structure from the base portion of the bonding pad; and
forming a second liner portion which separates the core portion from the cap portion of the bonding pad.

20. The method of claim 1, wherein the base layer comprises aluminum or an aluminum alloy.

* * * * *